US011232982B2

(12) United States Patent
Huang et al.

(10) Patent No.: US 11,232,982 B2
(45) Date of Patent: Jan. 25, 2022

(54) DEPOSITION SYSTEM AND METHOD USING THE SAME

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Jian-Zhi Huang, Changhua County (TW); Yun-Hsuan Hsu, Hsinchu County (TW); I-Chih Ni, New Taipei (TW); Chih-I Wu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 165 days.

(21) Appl. No.: 16/740,192

(22) Filed: Jan. 10, 2020

(65) Prior Publication Data

US 2021/0217660 A1 Jul. 15, 2021

(51) Int. Cl.
*H01L 21/4763* (2006.01)
*H01L 21/768* (2006.01)
(Continued)

(52) U.S. Cl.
CPC ........ *H01L 21/76843* (2013.01); *C23C 16/26* (2013.01); *C23C 16/505* (2013.01);
(Continued)

(58) Field of Classification Search
CPC ......... H01L 21/02444; H01L 21/02513; H01L 21/02595; H01L 21/02601; H01L 21/0262; H01L 21/28525; H01L 21/76807; H01L 21/7684; H01L 21/76843; H01L 21/76846; H01L 21/76849; H01L 21/76868;
(Continued)

(56) References Cited

U.S. PATENT DOCUMENTS 9,793,214 B1 * 10/2017 Venugopal ........ H01L 23/53271
2017/0210629 A1 * 7/2017 Cho .................... H01B 13/0036
(Continued)

FOREIGN PATENT DOCUMENTS

KR 10-1626776 B1 6/2016

OTHER PUBLICATIONS

Kumar, A. and Lee, C. H., "Synthesis and Biomedical Applications of Graphene:Present and Future Trends," Advances in Graphene Science,DOI: 10.5772/55728, pp. 55-75 (2013).
(Continued)

*Primary Examiner* — Brook Kebede
(74) *Attorney, Agent, or Firm* — Maschoff Brennan

(57) ABSTRACT

A method includes loading a wafer into a processing chamber, wherein the processing chamber is wound by a coil, and the coil is coupled to an RF system; supplying an aromatic hydrocarbon precursor into the processing chamber; after supplying the aromatic hydrocarbon precursor, turning on an RF power of the RF system to decompose the aromatic hydrocarbon precursor into active radicals and cyclize the active radicals into a graphene layer over a metal layer on the wafer; and after an entirety of the metal layer being covered by the graphene layer, turning off the RF power of the RF system to stop forming the graphene layer.

20 Claims, 30 Drawing Sheets

(51) Int. Cl.
*H01L 21/285* (2006.01)
*H01L 23/522* (2006.01)
*H01L 23/532* (2006.01)
*H01J 37/32* (2006.01)
*C23C 16/505* (2006.01)
*C23C 16/26* (2006.01)
*H01L 27/092* (2006.01)

(52) U.S. Cl.
CPC ...... *H01J 37/321* (2013.01); *H01J 37/32449* (2013.01); *H01L 21/28525* (2013.01); *H01L 21/7684* (2013.01); *H01L 21/76807* (2013.01); *H01L 21/76846* (2013.01); *H01L 21/76849* (2013.01); *H01L 21/76868* (2013.01); *H01L 21/76876* (2013.01); *H01L 23/5226* (2013.01); *H01L 23/53276* (2013.01); *H01J 2237/3321* (2013.01); *H01L 23/53209* (2013.01); *H01L 23/53238* (2013.01); *H01L 27/0928* (2013.01)

(58) Field of Classification Search
CPC .......... H01L 21/76876; H01L 23/5226; H01L 23/53276; C23C 16/26; C23C 16/505; C23C 16/511; H01J 37/321; H01J 37/32449
USPC ....................................................... 438/626
See application file for complete search history.

(56) References Cited

U.S. PATENT DOCUMENTS

| | | |
|---|---|---|
| 2019/0010604 A1 | 1/2019 | Boyd et al. |
| 2020/0026382 A1* | 1/2020 | Zhang .................. G06F 3/0412 |
| 2020/0039827 A1* | 2/2020 | Jung .................. H01L 21/02595 |

OTHER PUBLICATIONS

Shanmugam, R. et al., "A design of experiments investigation of the effects of synthesis conditions on the quality of CVD graphene," Materials Research Express, vol. 3, No. 12, 125601, pp. 1-13 (2016).

Boyd, D.A. et al., "Single-step deposition of high-mobility graphene at reduced temperatures," Nature Communications, vol. 6, No. 6620, pp. 1-8 (2015).

Grill, A., "Cold Plasma in Materials Fabrication: From Fundamentals to Applications," Wiley-IEEE Press, pp. 1-23 (1994).

Li, L. et al., "BEOL Compatible Graphene/Cu with Improved Electromigration Lifetime for Future Interconnects," 2016 IEEE International Electron Devices Meeting (IEDM),Accession No. 16651076, DOI: 10.1109/IEDM.2016.7838383, pp. 9.5.1-9.5.4 (2016).

* cited by examiner

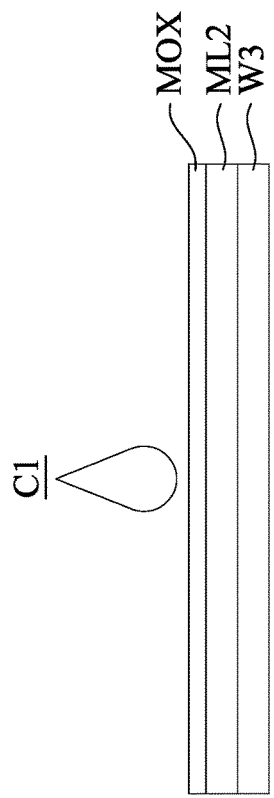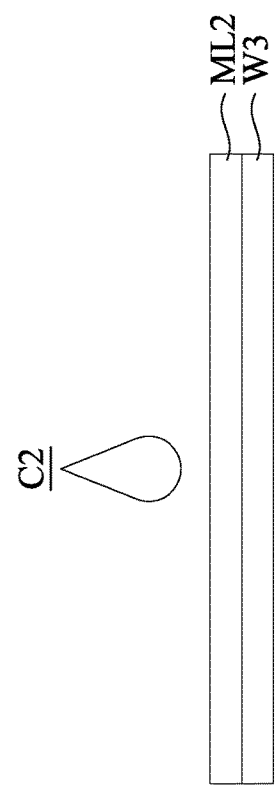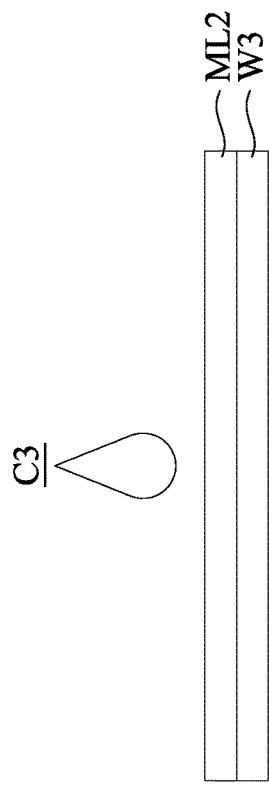

DEPOSITION SYSTEM AND METHOD USING THE SAME

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 to 11 illustrate a method in various stages of forming a graphene layer in accordance with some embodiments of the present disclosure.

DETAILED DESCRIPTION

Figure 1:
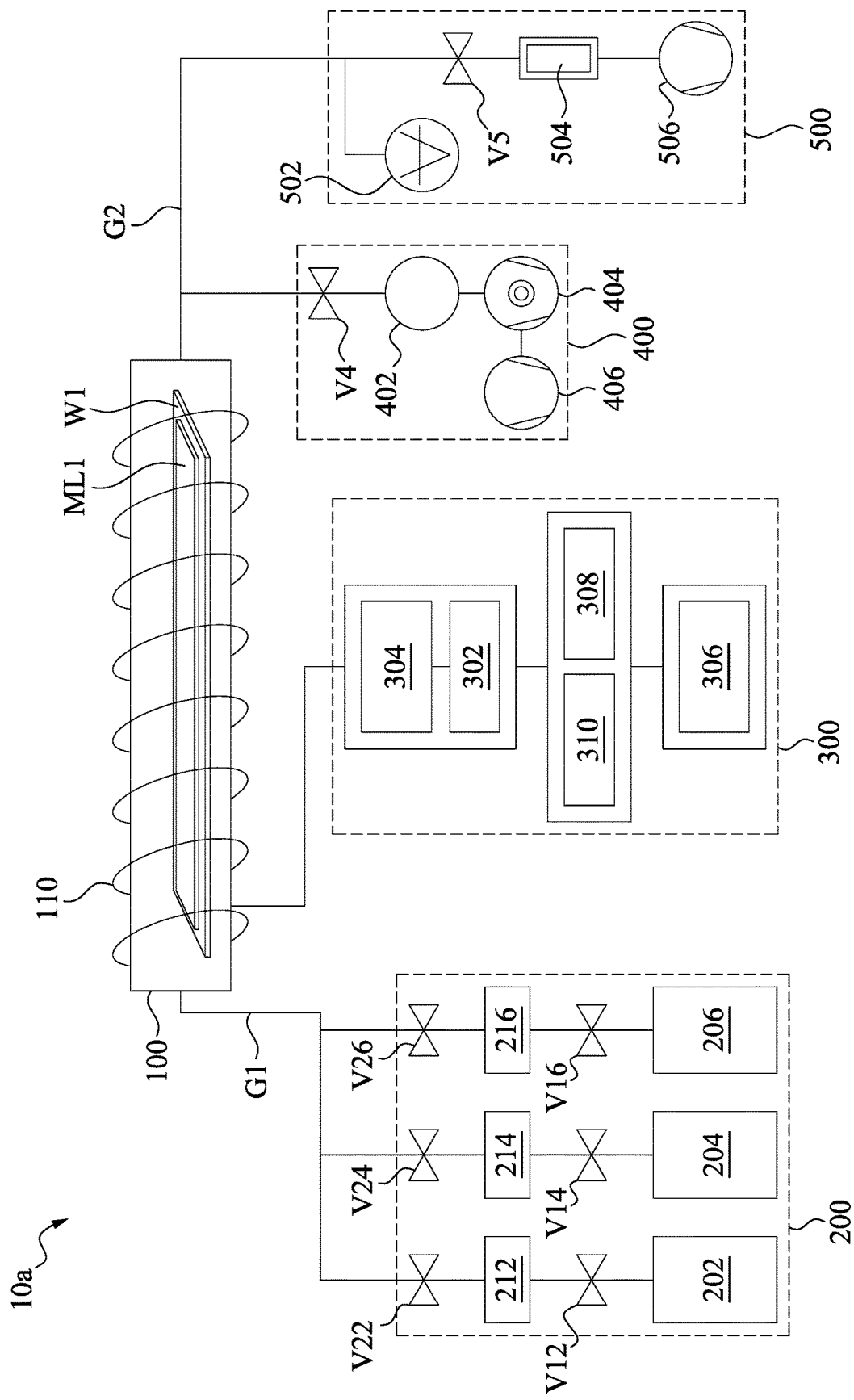
FIG. 1 is a deposition system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Plasma chamber are typically employed in performing various processes on semiconductor wafers, including etching processes and chemical vapor deposition processes, such as an inductively coupled plasma chemical vapor deposition (ICPCVD). An inductively coupled RF plasma chamber typically has an inductive coil antenna wound around a processing chamber and connected to a plasma source RF power supply. An inductively coupled RF plasma reactor can achieve a high plasma ion density for high production throughput, while avoiding a concomitant increase in ion bombardment damage of the wafer.

FIG. 1 is a deposition system in accordance with some embodiments of the present disclosure. Shown there is a deposition system 10a. In some embodiments, the deposition system 10a includes a processing chamber 100, a gas delivery system 200, an RF system 300, a residue gas analysis system 400, and a pumping system 500. In some embodiments, the gas delivery system 200 is connected to the processing chamber 100 via a gas delivery line G1, and the residue gas analysis system 400 and the pumping system 500 are connected to the processing chamber 100 via a gas delivery line G2. The RF system 300 is coupled to the processing chamber 100 by a coil 110 wound around the exterior of the processing chamber 100.

In some embodiments of FIG. 1, the processing chamber 100 is an elongated tube extending laterally. In some embodiments, the gas delivery lines G1 and G2 are fluidly communicated with the processing chamber 100, in which the gas delivery lines G1 and G2 are fluidly communicated with opposite sides of the processing chamber 100. The coil 110 is wound around the processing chamber 100 from a top to a bottom of the processing chamber 100. The processing chamber 100 can accommodate a wafer W1. For example, the wafer W1 includes a semiconductor substrate, such as a silicon substrate or a silicon dioxide substrate. A metal film ML1 can be deposited on the wafer W1. In some embodiments, the metal film ML1 can act as a catalytic layer for growing a graphene layer, which will be discussed later. The metal film ML1 can be, for example, cobalt, copper, nickel, ferrum, or any other suitable metal. The metal layer ML1 can be deposited on the substrate W1 using suitable processes, such as PVD, CVD, ALD, sputtering, electroplating, or the like.

In some embodiments, the inductive coil 110 is connected to the RF system 300 through a transmission line such as a wave guide or a co-axial cable. The coil 110 may be made of copper (Cu), or other suitable conductive materials. In some embodiments, the coil 110 has a multiple turn cylindrical configuration and may have an electrical length of about one-quarter wavelength ($<\lambda/4$) at the operating frequency. For example, the coil 110 is positioned outside the processing chamber 100 for coupling the RF magnetic fields into the processing chamber 100. These induced RF magnetic fields ionize at least part of the process gases and thus form plasma in processing chamber 100.

With respect to the gas delivery system 200. In some embodiments, the gas delivery system 200 includes several sources 202, 204, and 206. In the example shown in FIG. 1, three sources are illustrated, while more or less sources may be applied in some other embodiments. The gas delivery system 200 includes several mass flow controllers 212, 214, 216, in which the mass flow controllers 212, 214, 216 are connected to the sources 202, 204, and 206 via valves V12, V14, V16, respectively. Moreover, the mass flow controllers 212, 214, 216 are connected to the gas delivery line G1 via valves V22, V24, V26, respectively.

In some embodiments, the source 202 is a liquid source, and thus the source 202 may include a liquid tank. For example, the liquid of the source 202 may be liquid aromatic hydrocarbon, such as benzene ($C_6H_6$) or toluene ($C_7H_8$). In some embodiments, the carbon elements of the liquid aromatic hydrocarbon (e.g, benzene or toluene) are used as a source for depositing a graphene layer discussed later.

On the other hand, the sources 204 and 206 are gas source, and thus the sources 204 and 206 may include gas cylinders. For example, the gases of the sources 204 and 206 may be $H_2$, Ar, $N_2$, $Cl_2$, or other suitable gases.

With respect to the RF system 300. The RF system 300 includes an RF source 302, a matching box 304, a controller 306, an isolator 308, and a remote control module 310. In some embodiments, the RF energy is supplied to the processing chamber 100 by the inductive coil 110 which is powered by the RF source 302 and the matching box 304.

The input of the matching box 304 is coupled to the RF source 302, which provides RF power for plasma generation. The matching box 304 is used to match the impedance of the coil 110 to the impedance of the RF source 302, in order to deliver the maximum power to the plasma in the processing chamber 100. In some embodiments, the matching box 304 includes a matching network, a Phase and Magnitude Detector (PMD) and a controller that automatically tunes the matching network using the information supplied by the PMD.

The controller 306 may control the operation of RF source 302. The controller 306 may include, for example, a computer including a central processing unit (CPU), a memory, and support circuits. The controller 306 operates under the control of a computer program stored in the memory or through other computer programs, such as programs stored in a removable memory. The computer program dictates, for example, the timing, mixture of gases, RF power levels and other parameters of a particular process.

The remote control module 310 is electrically coupled between the controller 306 and the RF source 302. In some embodiments, the remote control module 310 enables the controller 306 to operate the RF source 302 remotely.

The isolator 308 is electrically coupled to the RF source 302, the remote control module 310, and then the controller 306. Generally, the isolator 308 is used to isolate the RF source 302 from the remote control module 310. The isolator 308 is used to protect high-power RF energy from the RF source 302. If the RF source 302 is connected directly to a load (such as the coil 110), and the load is not well matched with the RF source 302, some power reaching the load will be reflected back to the remote control module 310 and then the controller 306 that could destroy the controller 306. The isolator 308 between the controller 306 and the RF source 302 will absorb most of the reflected RF energy, which in turn will protect the controller 306 from being destroyed.

With respect to the residue gas analysis system 400. The residue gas analysis system 400 includes a residue gas analyzer (RGA) 402, a main pump 404, and a backing vacuum pump 406. The RGA 402 is connected to the gas delivery line G2 via a valve V4. In some embodiments, the RGA 402 is a spectrometer that effectively measures the chemical composition of a gas present in a low-pressure environment. For example, the RGA 402 can ionize separate components of the gas to create various ions, and then detects and determines the mass-to-charge ratios. This process works better in vacuum, where quality is easier to monitor and impurities and inconsistencies are easier to detect because of the low pressure.

The main pump 404 is connected to the RGA 402, and the backing vacuum pump 406 is connected to the main pump 404. In some embodiments, the pumps 404 and 406 are connected in series so as to improve the pumping speed of the RGA 402. The backing vacuum pump 406 is used to lower pressure from one pressure state (typically atmospheric pressure) to a lower pressure state, and after which the main pump 404 is used to evacuate the process chamber down to high-vacuum levels needed for processing. In some embodiments, the main pump 404 may be a turbo pump, a cryo pump, an ion pump, a diffusion pump, or the like. The backing vacuum pump 406 may be a rotary vane pump, a scroll pump, or the like. The gas exhausted from the backing vacuum pump may be discharged into a gas handling system (not shown) of a FAB via a gas conduit.

With respect to the pumping system 500. In some embodiments, the pumping system 500 includes a pressure gauge 502, a foreline trap 504, and a vacuum pump 506. The foreline trap 504 in connected to the gas delivery line G2 via a valve V5. The remainder of the gas mixture exhausted from the processing chamber 100, including reaction products or byproducts, is evacuated from the processing chamber 100 by the vacuum pump 506. In some embodiments, the foreline trap 504 may be a particle collector or a particle filter, which is positioned downstream from the exhaust gas source (e.g., processing chamber 100). In some embodiment, the foreline trap 504 is positioned as close as possible to the processing chamber 100 in order to maximize the amount of powder and other particulate matter that is collected within the processing chamber 100 and minimize the amount that is deposited within other areas of the gas delivery line G2. In some other embodiments, the foreline trap 504 may be a cooling trap, which recycles process gases by removing condensable material from the process gases when flowing through the foreline trap 504.

Figure 2:
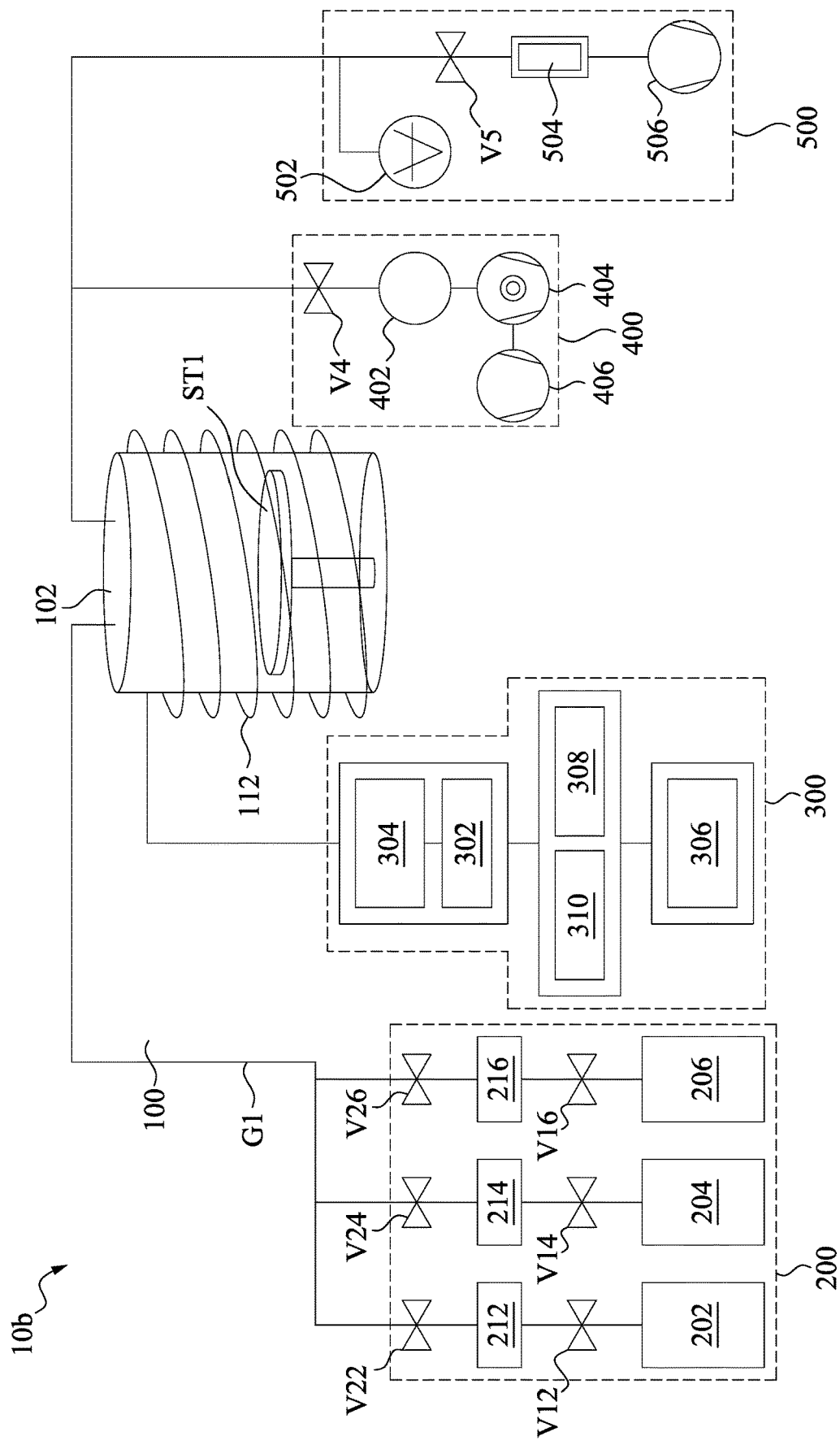
FIG. 2 is a deposition system in accordance with some embodiments of the present disclosure.

FIG. 2 is a deposition system 10b in accordance with some embodiments of the present disclosure. It is noted that some elements in FIG. 2 are the same as those described in FIG. 1, and thus such elements are labeled the same and relevant structural details will not be repeated for brevity. In FIG. 2, shown there is a processing chamber 102, in which the processing chamber 102 is a vertical tube extending vertically. A coil 112 is wound around the processing chamber 100 from one side to another side. A wafer stage ST1 is disposed in the processing chamber 102. In some embodiments, the wafer stage ST1 can hold and/or support a wafer (e.g., the wafer W1 in FIG. 1) during processing. In some embodiments, the gas delivery lines G1 and G2 are both fluidly communicated with a ceiling (top) of the processing chamber 102. That is, the gas inlet and the gas outlet are disposed at the same side of the processing chamber 102.

Figure 3:
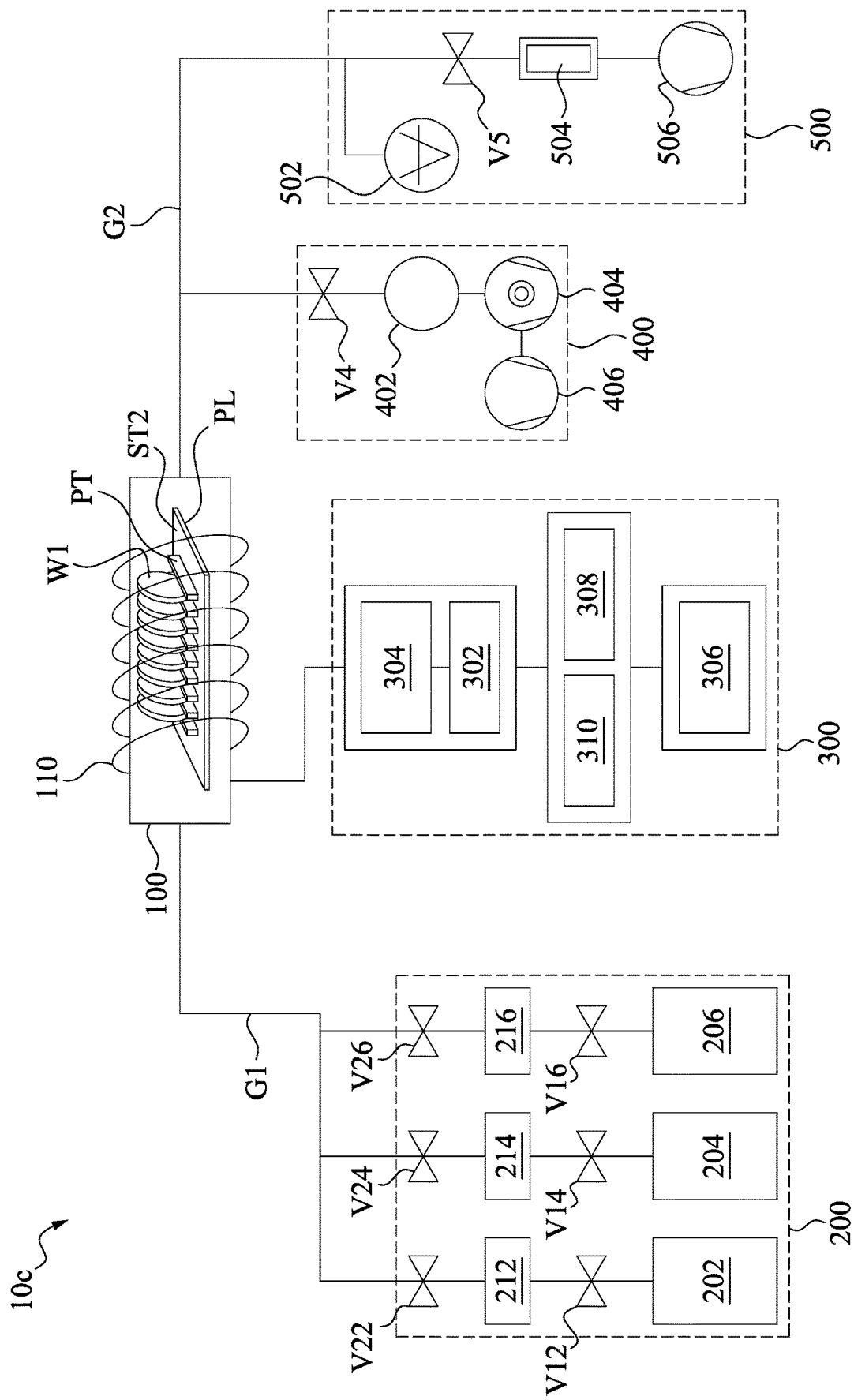
FIG. 3 is a deposition system in accordance with some embodiments of the present disclosure.

FIG. 3 is a deposition system 10c in accordance with some embodiments of the present disclosure. It is noted that some elements in FIG. 3 are the same as those described in FIG. 1, and thus such elements are labeled the same and relevant structural details will not be repeated for brevity. In FIG. 3, a wafer stage ST2 is disposed in the processing chamber 100. In some embodiments, the wafer stage ST2 has a plate PL and a plurality of protrusion portions PT extending upwardly from the plate PL. The protrusion portions PT form a plurality of grooves therebetween, such that a plurality of wafers W2 can be placed in the grooves between the protrusion portions PT of the wafer stage ST2. In some embodiments, the wafers W2 are substantially placed vertically on the wafer stage ST2.

FIGS. 4-11 illustrate a method in various stages of forming a graphene layer in accordance with some embodiments of the present disclosure.

Reference is made to FIG. 4. Shown there is a substrate W3. In some embodiments, the substrate W3 may include a semiconductor material and may include known structures including a graded layer or a buried oxide, such as silicon dioxide ($SiO_2$). In some embodiments, the substrate W3 includes bulk silicon that may be undoped or doped (e.g., p-type, n-type, or a combination thereof). Other materials, such as germanium, quartz, sapphire, and glass could alternatively be used for the substrate W3.

A metal layer ML2 is deposited over the substrate W3. In some embodiments, the metal layer ML2 is a metal foil or a metal film. For example, the metal layer ML2 may include copper (Cu), cobalt (Co), nickel (Ni), ferrum (Fe), or other suitable materials. The metal layer ML2 can be deposited on the substrate W3 using suitable processes, such as PVD, CVD, ALD, sputtering, electroplating, or the like. In some embodiments, the thickness of the metal layer ML2 is in a range from about 10 nm to about 100 nm. In some embodiments, because the metal layer ML2 is exposed to the air, thus a metal oxide layer MOX may be formed over the metal layer ML2 due to oxidation. The metal oxide layer MOX is an oxide of the metal layer ML2. For example, if the metal layer ML2 is made of Cu, the metal oxide layer MOX may be CuO.

A first cleaning process C1 is performed to clean the surface of the substrate . . . . In greater detail, the first cleaning process C1 is used to remove some contaminations over the metal oxide layer MOX. In some embodiments, the cleaning solvent of the first cleaning process C1 is an organic solvent. The organic solvent may have a polar function, such as —OH, —COOH, —CO—, —O—, —COOR, —CN—, —SO—, as non-limiting examples. In various embodiments, the organic solvent may include PGME, PGEE, GBL, CHN, EL, Methanol, Ethanol, Propanol, n-Butanol, Acetone, DMF, Acetonitrile, IPA, THF, Acetic acid, or combinations thereof.

Reference is made to FIG. 5. A second cleaning process C2 is performed to remove the metal oxide layer MOX from the metal layer ML2. After the second cleaning process C2, the top surface of the metal layer ML2 is exposed. In some embodiments, the cleaning solvent of the second cleaning process C2 may be a mineral acid (e.g., inorganic acid), such as hydrofluoric acid (HF), hydrochloric acid (HCl), nitric acid ($HNO_3$), sulfuric acid ($H_2SO_4$), or the like. In some embodiments where a copper metal layer ML2 is cleaned by a 5% nitride acid, the duration of the second cleaning process C2 is in a range from about 2 seconds to about 4 seconds (e.g., 3 second in some embodiments). If the duration of the second cleaning process C2 is too short, the metal oxide layer MOX may not be sufficiently removed. While if the duration of the second cleaning process C2 is too long, the cleaning solvent of the second cleaning process C2 may cause unwanted etch to the metal layer ML2.

Reference is made to FIG. 6. A third cleaning process C3 is performed to remove the residue of the cleaning solvent of the second cleaning process C2. In some embodiments, the third cleaning process C3 may use deionized water (DI water) to remove the cleaning solvent (e.g., mineral acid) of the second cleaning process C2.

Figure 7:
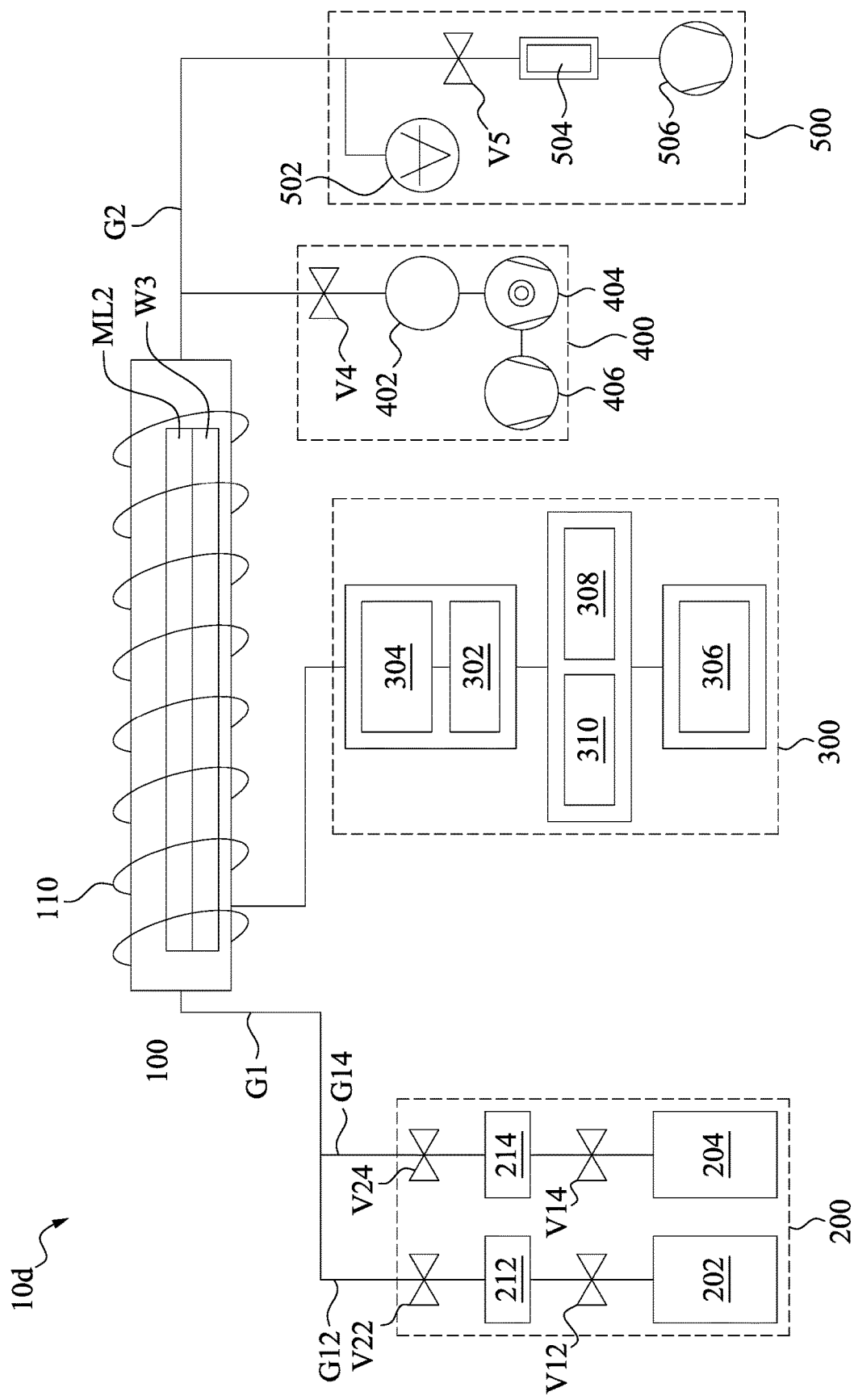

Reference is made to FIG. 7, in which a deposition system 10d is shown in FIG. 7. It is noted that some elements of the deposition system 10d in FIG. 7 are the same as those described in FIG. 1, and thus such elements are labeled the same and relevant structural details will not be repeated for brevity. After the third cleaning process C3, the substrate W3 is loaded into the processing chamber 100.

In some embodiments, the gas delivery system 200 of the deposition system 10d in FIG. 7 only includes two sources 202, 204. For example, the source 202 is a liquid source, and thus the source 202 may include a liquid tank. For example, the liquid of the source 202 may be liquid aromatic hydrocarbon, such as benzene ($C_6H_6$) or toluene ($C_7H_8$). In some embodiments, the carbon elements of the liquid aromatic hydrocarbon (e.g, Benzene or Toluene) are used as a source for depositing a graphene layer discussed later. On the other hand, the source 204 is a gas source, and thus the source 204 may include gas cylinder. In some embodiments, the gas of the source 204 may be $H_2$. In some embodiments, a gas delivery line G12 connects the source 202 to the gas delivery line G1 (or the processing chamber 100), and a gas delivery line G14 connects the source 204 to the gas delivery line G1 (or the processing chamber 100).

Figure 8:
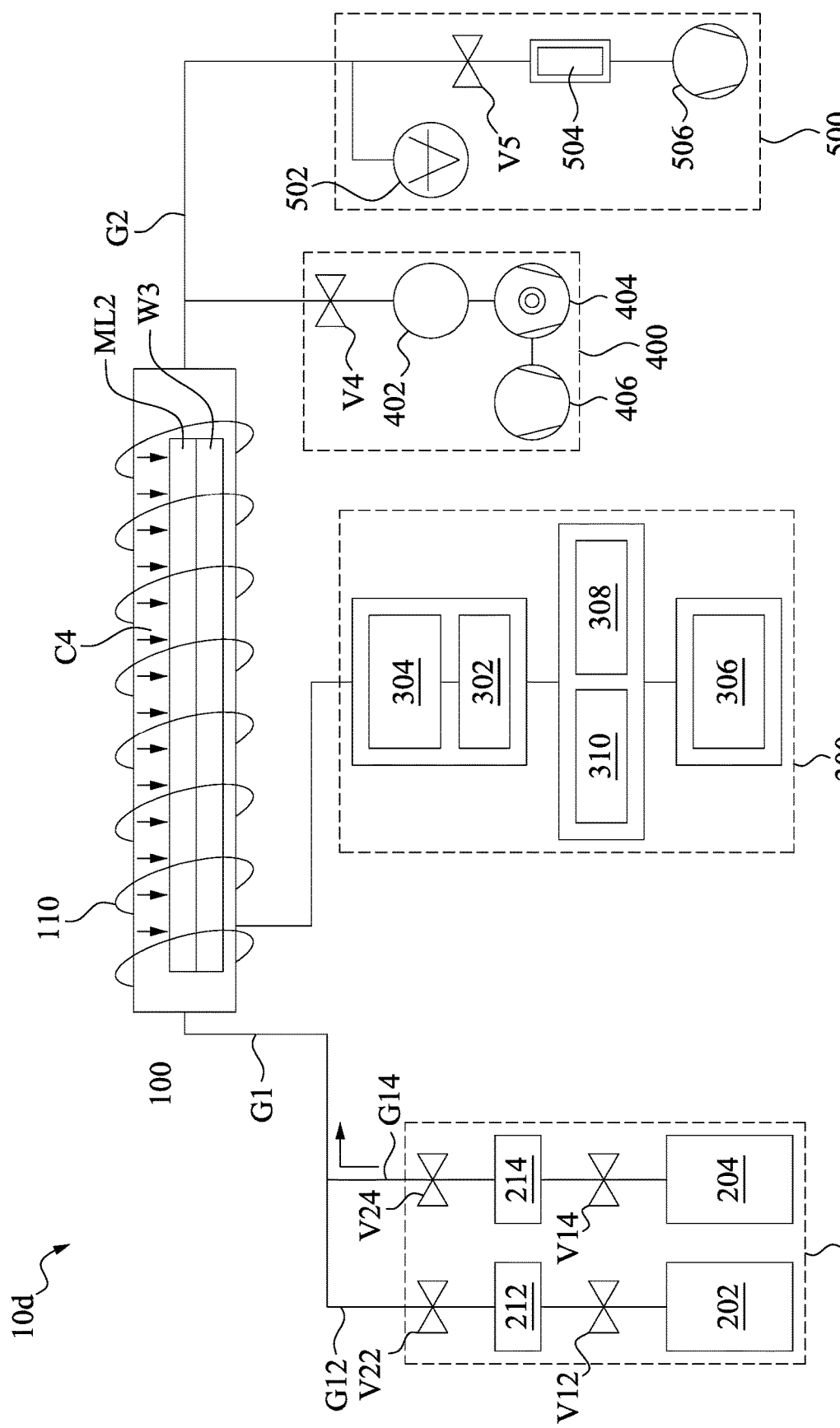

Reference is made to FIG. 8. A fourth cleaning process C4 is performed to clean the substrate W3. The cleaning process C4 is performed by, for example, turning on the valves 14 and 24 of the gas delivery system 200, such that the gas inside the source 204 can flow through the mass flow controller 214 and then flows into the gas delivery lines G14 and G1. For example, $H_2$ flows from the source 204 into the processing chamber 100 through the gas delivery lines G14 and G1. In some embodiments, the mass flow controller 214 is controlled such that the flow rate of $H_2$ is in a range from about 1 sccm to about 5 sccm.

Meanwhile, the RF source 302 of the RF system 300 is turned on with an RF power in a range from about 150 W to about 200 W, such that the $H_2$ flows into the processing chamber 100 becomes hydrogen plasma ($H_2$ plasma). The hydrogen plasma may etch and clean the metal layer ML2 over the substrate W3. The plasma can remove unwanted metal oxide on the substrate W3. For example, $H^+ + CuO \rightarrow Cu + H_2O$, in which an reduction-oxidation process takes place, such that the CuO becomes Cu. In some embodiments, the duration of the fourth cleaning process C4 is in a range from about 4 mins to about 6 mins (e.g., 5 mins in some embodiments). If the duration of the fourth cleaning process C4 is too short, the metal layer ML2 may not be sufficiently cleaned. While if the duration of the fourth cleaning process C4 is too long, the hydrogen plasma of the fourth cleaning process C4 may cause unwanted consumption to the metal layer ML2. On the other hand, the fourth cleaning process C4 can also activate the surface of the metal layer ML2. The hydrogen plasma removes unwanted metal oxide on the metal layer ML2 to make sure the surface of the metal layer ML2 is pure metal (e.g., Cu), such that the metal can act as catalyst in the following graphene deposition process.

It is noted that in the step of FIG. 8, the valve 22 of the gas delivery system 200 is turned off, such that only the gas (e.g., $H_2$) in the source 204 is supplied into the processing chamber 100 during cleaning the substrate W3. That is, during the fourth cleaning process C4, the processing chamber 100 is free of aromatic hydrocarbon. On the other hand, during the fourth cleaning process C4, the pumping system 500 is turned on, so as to pump out the gas (e.g., $H_2$) in the processing chamber 100. In greater detail, the gas (e.g., $H_2$) in the processing chamber 100 is pumped out to the pumping system 500 through the gas delivery line G2. In some embodiments, during the fourth cleaning process C4 of FIG. 8, the gas environment of the processing chamber 100 is substantially a pure hydrogen ($H_2$) environment.

Figure 9:
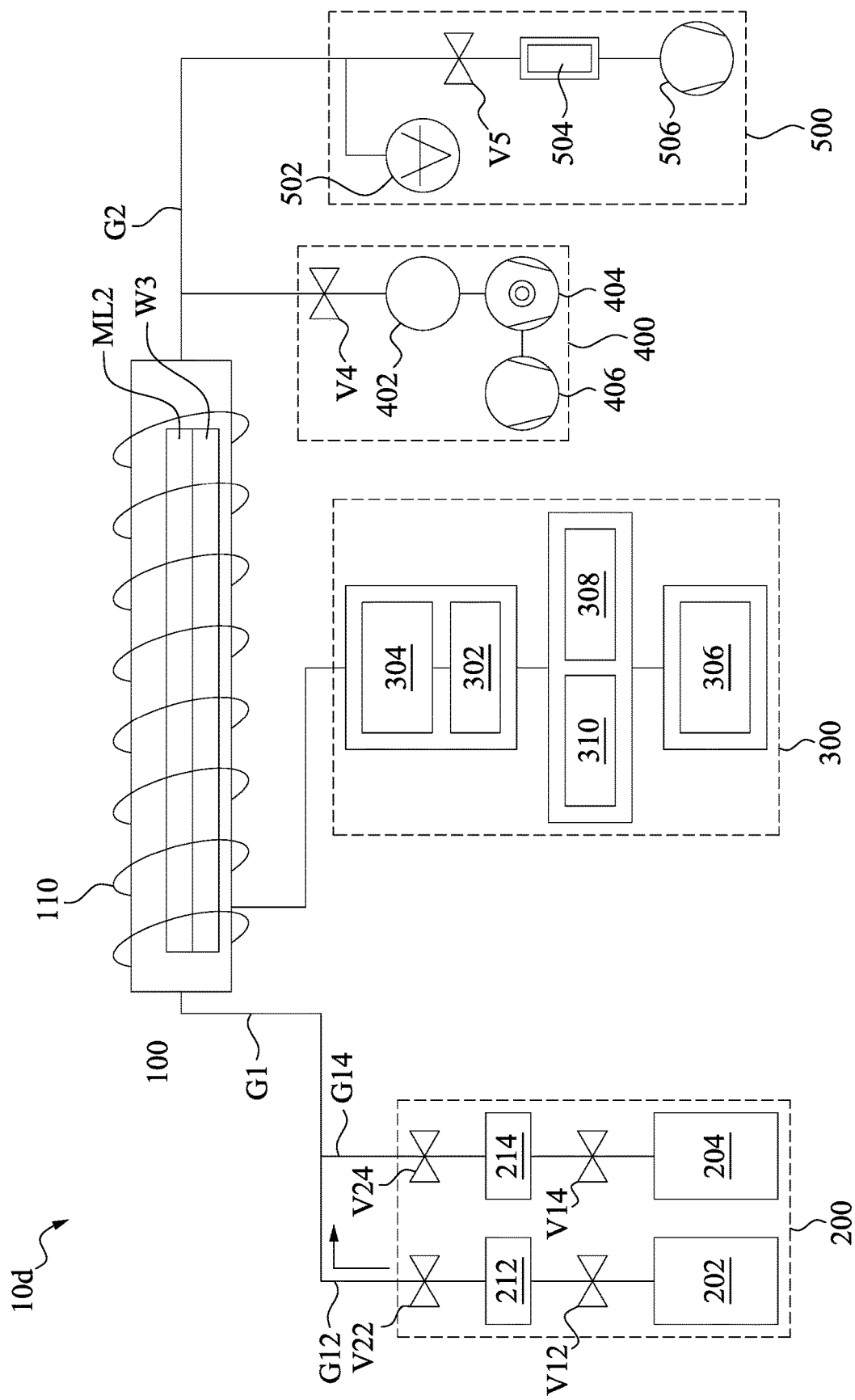

Reference is made to FIG. 9. After cleaning the metal layer ML2 of FIG. 8, the valve 24 of the gas delivery system 200 is turned off, such that the gas (e.g., $H_2$) in the source 204 is stopped being supplied into the processing chamber 100. Meanwhile, the RF system 300 is turned off. That is, the RF power of the RF system 300 in this step is zero value or negligible small. On the other hand, the pumping system 500 may pump out (remove) the remaining gas (e.g., hydrogen gas $H_2$) in the processing chamber 100, so as to create a vacuum environment in the processing chamber 100.

Then, the valves 12 and 22 of the gas delivery system 200 are turned on. As mentioned above, the source 202 is a liquid source. The liquid source may be liquid aromatic hydrocarbon, such as benzene ($C_6H_6$) or toluene ($C_7H_8$). In some embodiments, the aromatic hydrocarbon (e.g., benzene or toluene) is used as a precursor for depositing a graphene layer discussed in FIG. 10. Although the source 202 is a liquid aromatic hydrocarbon source, the liquid aromatic hydrocarbon may volatilize easily. Accordingly, as the valve 12 is turned on, the liquid aromatic hydrocarbon in the source 202 may volatilize and transform from a liquid phase to a gas phase, and the aromatic hydrocarbon gas (e.g., Benzene gas or Toluene gas) may flow through the mass flow controller 212 and then flows into the gas delivery lines G12 and G1. For example, the aromatic hydrocarbon gas flows from the source 202 into the processing chamber 100 through the gas delivery lines G12 and G1. In some embodiments, the mass flow controller 212 is controlled such that the flow rate of the aromatic hydrocarbon gas is in a range from about 0.1 sccm to about 1 sccm. If the flow rate is too low (e.g., much lower than 0.1 sccm), the concentration of the aromatic hydrocarbon gas may be too low to provide sufficient carbon. If the flow rate is too high (e.g., much higher than 1 sccm), the carbon concentration may be too high and may affect the quality of graphene layer. In some embodiments, the aromatic hydrocarbon gas is supplied into the processing chamber 100 without a using carrier gas, such as Ar or $H_2$. That is, the gas environment of the processing chamber 100 is substantially a pure aromatic hydrocarbon gas environment in this step, which will facilitate the formation of graphene layer in FIG. 10.

It is noted that in the step of FIG. 9, the valves 24 of the gas delivery system 200 has been turned off, such that only the aromatic hydrocarbon in the source 202 is supplied into the processing chamber 100. In some embodiments, the aromatic hydrocarbon gas is used as a precursor in the deposition process in FIG. 10, and thus aromatic hydrocarbon gas can be interchangeably referred to as aromatic hydrocarbon precursor in the following content.

Figure 10:
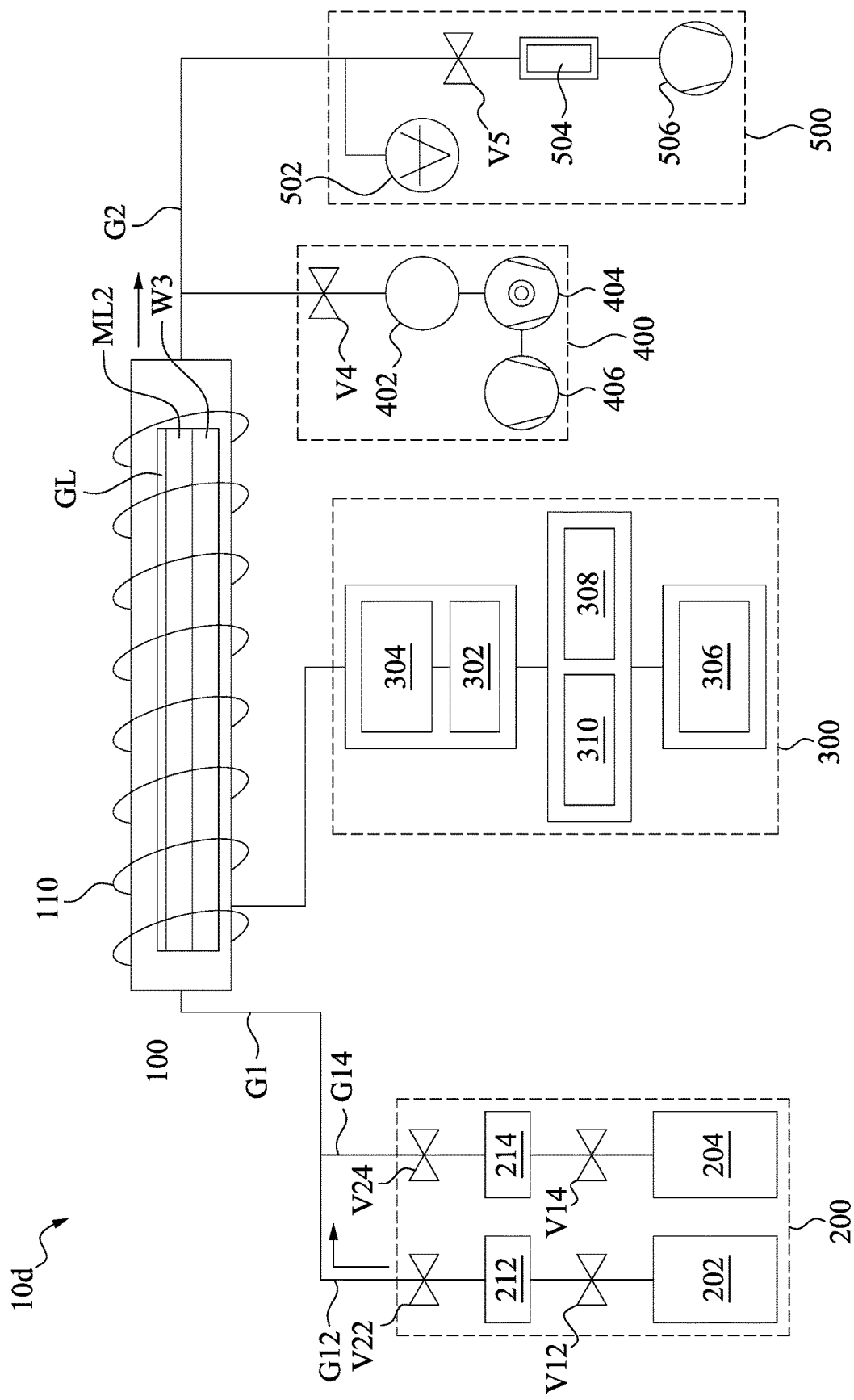

Reference is made to FIG. 10. The RF source 302 of the RF system 300 is turned on with an RF power in a range from about 250 W to about 400 W, so as to generate plasma of aromatic hydrocarbon in the processing chamber 100, and then form a graphene layer GL over the metal layer ML2. If the RF power is too low (e.g., much lower than 250 W), the aromatic hydrocarbon may not be sufficiently decomposed. If the RF power is too high (e.g., much higher than 400 W), the plasma may be too strong to cause unwanted etching to the metal layer ML2.

Reference is made to FIGS. 12A-12D, in which FIGS. 12A-12D illustrate a mechanism for growing a graphene layer using aromatic hydrocarbon precursor.

Figure 12B:
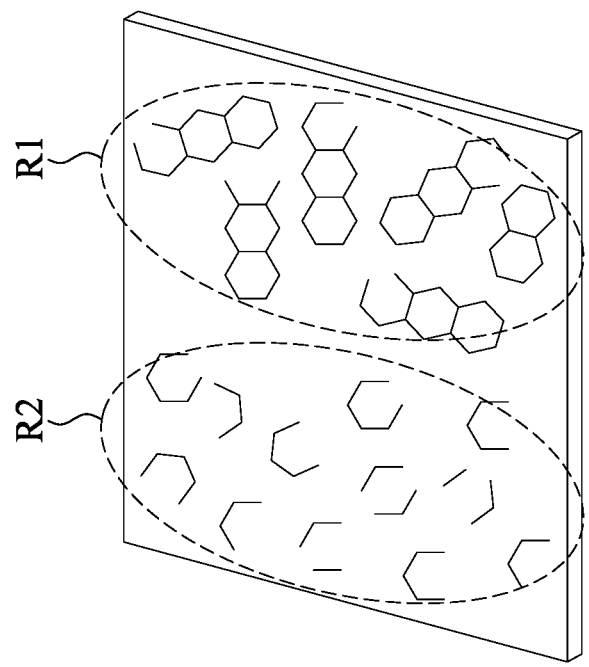
FIGS. 12A to 12D illustrate a mechanism for growing graphene layer in accordance with some embodiments of the present disclosure.
Figure 12A:
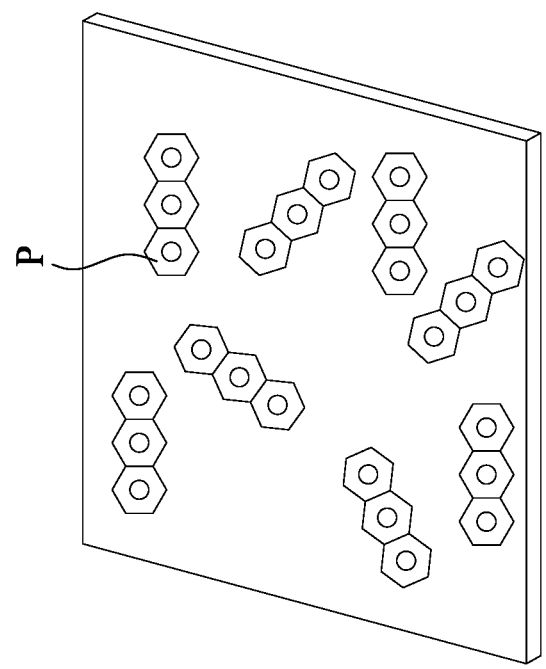

In FIG. 12A, an aromatic hydrocarbon precursor P is provided over a metal layer ML (e.g., metal layer ML2 in FIG. 10). For example, the aromatic hydrocarbon precursor P can be provided in to a processing chamber (e.g., processing chamber in FIG. 10) and over a metal layer (e.g., metal layer ML2).

In FIG. 12B, an RF power of an RF system (e.g., the RF system 300 in FIG. 10) is turned on, such that the aromatic hydrocarbon precursor P is decomposed (or ionized) into several active radical species, which constitute the plasma over the metal layer ML. For example, the active radical species of the plasma may include aromatic radicals R1 and smaller radicals R2. The "aromatic radical" used herein indicates a radical including at least one ring of resonance bonds, such as a benzene ring. On the other hand, the "smaller radical" used herein indicates a radical not including a ring of resonance bonds, such as a benzene ring. In some embodiments where the flow rate of the aromatic hydrocarbon precursor is in a range from about 0.5 sccm to about 1 sccm, the RF power is in a range from about 250 W to about 400 W, and the processing pressure is in a range from about $1\times10^{-2}$ torr to about $2\times10^{-2}$ torr, the smaller radicals are likely to be predominant due to ring opening. That is, the proportion of the smaller radicals R2 is higher than the proportion of the aromatic radicals R1 in the plasma. In some embodiments of the present disclosure, the processing chamber is substantially filled with smaller radicals R2 and without aromatic radicals R1.

Figure 12D:
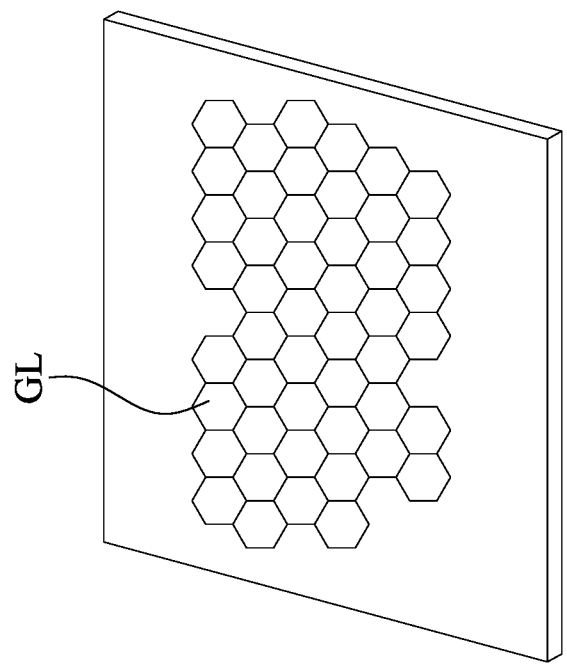
Figure 12C:
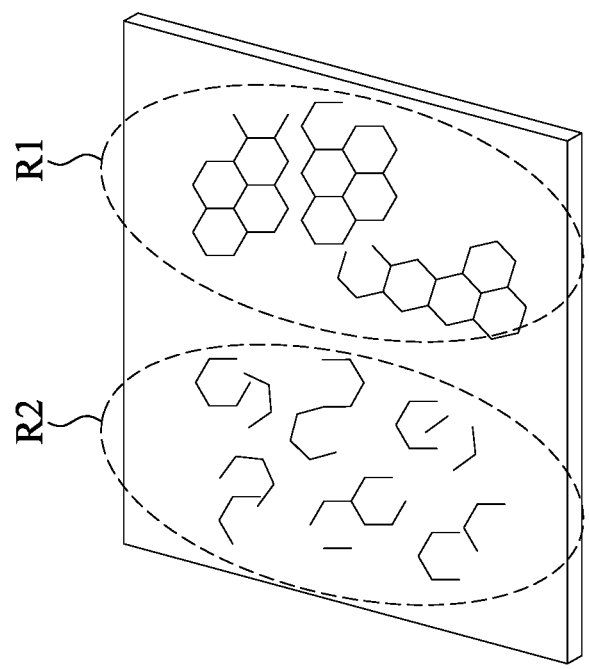

In FIG. 12C, the active radicals R1 and R2 may be deposited on the surface of the metal layer and may diffuse on the surface of the metal layer ML. In some embodiments, some radicals (such as radicals R1 and R2) will be gathered together and are close to each other. This mechanism is called "surface diffusion" of the radicals R1 and R2.

In FIG. 12D, a dehydrogenation reaction and a cyclization reaction may take place, and then covalent bonding of the active radicals (e.g., active radicals R1 and R2) and/or rings form a graphene layer GL. The "dehydrogenation" used herein indicates a chemical reaction that involves the removal of hydrogen from an organic molecule (e.g., the active radicals R1 and R2). The "cyclization" used herein indicates the process that the radicals (e.g., the active radicals R1 and R2) are combined and transformed into 'benzene' rings. Generally, the RF power of the RF system is turned on to decompose the aromatic hydrocarbon precursor into active radicals, and the active radicals are then cyclized into a graphene layer.

Referring back to FIG. 10. As mentioned above, before the RF source 302 of the RF system 300 is turned on, the processing chamber 100 is already filled with the aromatic hydrocarbon precursor (see FIG. 9). Accordingly, once the RF source 302 of the RF system 300 is turned on, the plasma of aromatic hydrocarbon can be generated immediately, and the deposition of the graphene layer GL takes place. That is, the RF system 300 is operative to trigger the graphene deposition discussed herein. For example, the aromatic hydrocarbon precursor is decomposed into several active radicals (e.g., the active radicals R1 and R2 in FIG. 12B). Then, a dehydrogenation reaction and a cyclization reaction take place, therefore forming the graphene layer GL on the metal layer ML2.

In some embodiments, the flow rate of the aromatic hydrocarbon precursor is in a range from about 0.5 sccm to about 1 sccm, the RF power is in a range from about 250 W to about 400 W, and the processing pressure is in a range from about $1\times10^{-2}$ torr to about $2\times10^{-2}$ torr. As mentioned above, in this situation, the smaller radicals (e.g., radicals R2 in FIGS. 12B and 12C) will occupy a predominant proportion of the active radicals rather than the aromatic radicals (e.g., radicals R1 in FIGS. 12B and 12C). In some embodiments, all of the active radicals are smaller radicals. That is, the plasma of the aromatic hydrocarbon is free of aromatic radicals. Generally, when a precursor for depositing a graphene layer is methane ($CH_4$), acetylene ($C_2H_2$), or ethylene ($C_2H_4$), it will take longer time to form a graphene layer because each molecule provides less carbon atoms. However, because the precursor for depositing the graphene layer is an aromatic hydrocarbon precursor, a molecule of an aromatic hydrocarbon can provide more carbon atoms (e.g., $C_6H_6$ or $C_7H_8$) than a molecule of methane ($CH_4$), acetylene ($C_2H_2$), or ethylene ($C_2H_4$). Accordingly, a deposition rate of the graphene layer GL can be increased when using an aromatic hydrocarbon precursor in some embodiments of the present disclosure.

After an entirety of the metal layer ML2 is covered by the graphene layer GL and/or after the graphene layer GL is grown to a desired thickness, the RF power of the RF system 300 can be turned off, so as to stop depositing the graphene layer GL. This is because the plasma is stopped generated. In some embodiments, the deposition time of the graphene layer GL is defined as a time duration between turning on the RF power of the RF system 300 and turning off the RF power of the RF system 300. In some embodiments, the deposition time of the graphene layer GL is in a range from about 30 seconds to about 120 seconds (2 minutes), and the thickness of the graphene layer GL is in a range from about 1 nm to about 10 nm. For example, if the deposition time is about 30 second, the deposited thickness of the graphene layer GL is about 1 nm to about 2 nm. If the deposition time is about 120 seconds (2 minutes), the deposited thickness of the graphene layer GL is about 9 nm to about 10 nm. In some embodiments, if the deposition time is too short (e.g., much lower than 30 second), the thickness of the graphene layer GL may be undesired. On the other hand, if the deposition time is too long (e.g., much longer than 120 seconds), the graphene layer GL may undergo an unwanted damage. In greater detail, during the dehydrogenation reaction of the active radicals as described in FIGS. 12A to 12D, hydrogens ($H_2$) are removed from the active radicals. However, the RF power provided by the RF system 300 may transform the $H_2$ gas into $H_2$ plasma as well, while the $H_2$ plasma may etch the graphene layer GL. Because a longer deposition time of the graphene layer GL will also cause more dehydrogenation reactions of the active radicals, more $H_2$ plasma will be induced, and thus the graphene layer GL and the metal layer ML2 may be etched, which will deteriorate the quality of the graphene layer GL and the metal layer ML2.

For example, if the aromatic hydrocarbon precursor is toluene, the deposition time of the graphene layer GL is in a range from about 60 seconds to about 120 seconds, the resistance of the graphene layer GL is about 0.5 kΩ to about 1.5 kΩ (e.g. 1 kΩ). While experiment result shows that if the depositon time is too long (e.g., much longer than 120 seconds), the resistance of the graphene layer GL may increase. On the other hand, if the aromatic hydrocarbon precursor is benzene, the deposition time of the graphene layer GL is in a range from about 60 seconds to about 120 seconds, the resistance of the graphene layer GL is about 2.5 kΩ to about 3.5 kΩ (e.g., 3 kΩ). While experiment result shows that if the depositon time is too long (e.g., much longer than 120 seconds), the resistance of the graphene layer GL may increase.

On the other hand, if the deposition time of the graphene layer GL is too long, the metal layer ML2 may also undergo an unwanted etch by the $H_2$ plasma. In some embodiments where the deposition time of the graphene layer GL is about 60 seconds to about 120 seconds, the thickness loss of metal layer ML2 by the $H_2$ plasma etching is zero or negligible small. In some embodiments, if the deposition time of the graphene layer GL is about 2 mins, the thickness loss of the metal layer ML2 may be about 0 nm to about 1.1 nm. While the deposition time of the graphene layer GL is about 5 mins, the thickness loss of the metal layer ML2 may be about 2 nm to about 3 nm.

According to the above discussion, the graphene layer GL can be deposited over a large area. For example, in some embodiments where the area of the metal layer M3 is about 12*2 $cm^2$, experiment results show that the graphene layer GL has a uniform region having an area about 8*2 $cm^2$ to about 10*2 $cm^2$ (e.g., 9*2 $cm^2$). In some embodiments, graphene layer GL has higher resistance at opposite edges of the graphene layer GL than the middle region of the graphene layer GL. This is because the plasma is generally lower at opposite sides of the coil 110 than at middle of the coil 110, and such that the chemical activity of carbon source may be lower at the opposite sides of the coil 110, which will result in that the graphene layer GL cannot be sufficiently grown on opposite sides of the metal layer M3, therefore increasing the resistance at opposite edges of the graphene layer GL.

It is noted that in the present disclosure, the aromatic hydrocarbon precursor is supplied into the processing chamber 100 without using a carrier gas, such as Ar or $H_2$. This will improve the quality of the deposited graphene layer GL, because the RF power provided by the RF system 300 may transform the carrier gas into plasma (e.g., Ar plasma or $H_2$ plasma), while the such plasma may etch the graphene layer GL during deposition.

On the other hand, the temperature inside the processing chamber 100 is determined by the temperature of the coil 110, because the RF power will raise the temperature of the coil 110. For example, the RF power of the RF system 300 may generate plasma of aromatic hydrocarbon, which will also raise the temperature in the processing chamber 100 to about 200° C. to about 400° C. If RF power is too low, the temperature in the processing chamber 100 may be low (e.g., much lower than 200° C.), and the RF power may not be high enough to generate plasma in the processing chamber 100. If the RF power is too high, the temperature in the processing chamber 100 may be high (e.g., much higher than 200° C.), some devices in the front end of line (FEOL) may be destroyed. In some embodiments where a semiconductor device, such as a transistor, is formed on the substrate W, such a processing chamber having a temperature from about 200° C. to about 400° C. would not destroy the semiconductor device, which will improve the device yield. In this way, the graphene layer GL can be grown without using other heater other than the RF system 300. Stated another way, the deposition system 10d is free of a heater other than the RF system 300. That is, the deposition temperature of the graphene layer GL is the ambient temperature of the deposition system 10d.

Figure 11:
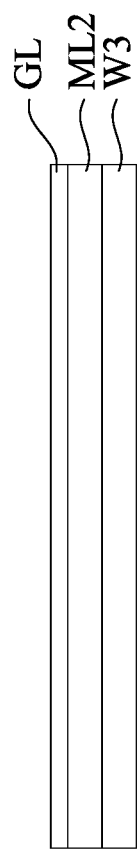

Reference is made to FIG. 11. After the RF power of the RF system 300 (see FIG. 10) is turned off, the substrate W3 is moved out from the processing chamber 100 (see FIG.

10). In some embodiments, before moving out the substrate W3 from the processing chamber 100, the valve 22 of the gas delivery system 200 may be turned off, so as to stop providing aromatic hydrocarbon precursor into the processing chamber 100.

It is noted that the deposition system 10d described in FIGS. 7-10 are similar to the deposition system 10a described in FIG. 1. While the deposition system 10d may be similar to the deposition systems 10b and 10c described respectively in FIGS. 2 and 3 in some other embodiments.

Figure 13:
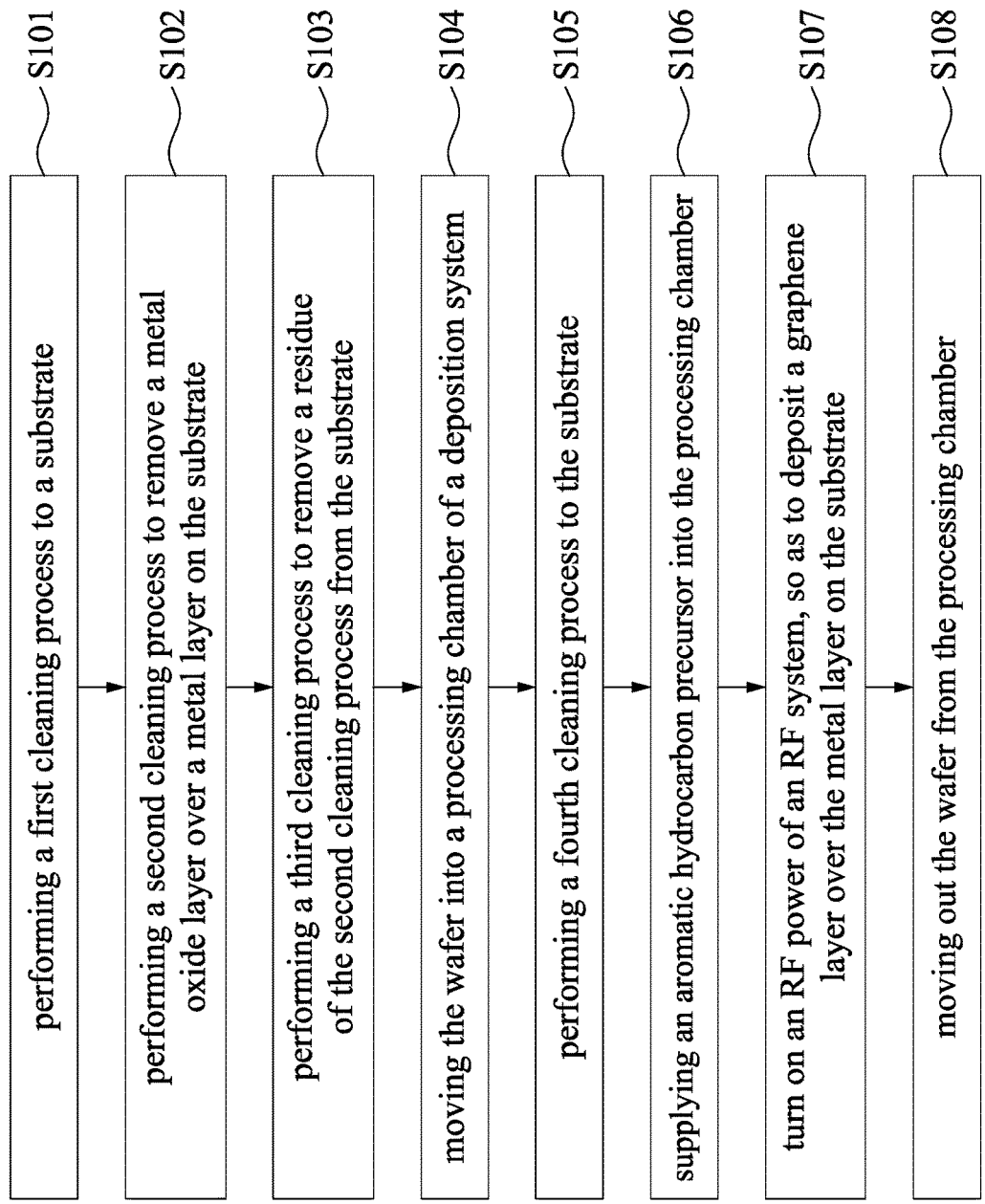
FIG. 13 is a method for forming a semiconductor device in accordance with some embodiments of the present disclosure.

FIG. 13 illustrates a method 1000 of manufacturing in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, performing a first cleaning process to a substrate. FIG. 4 illustrates a schematic view of some embodiments corresponding to act in block S101.

At block S102, performing a second cleaning process to remove a metal oxide layer over a metal layer on the substrate. FIG. 5 illustrates a schematic view of some embodiments corresponding to act in block S102.

At block S103, performing a third cleaning process to remove a residue of the second cleaning process from the substrate. FIG. 6 illustrates a schematic view of some embodiments corresponding to act in block S103.

At block S104, moving the wafer into a processing chamber of a deposition system. FIG. 7 illustrates a schematic view of some embodiments corresponding to act in block S104.

At block S105, performing a fourth cleaning process to the substrate. FIG. 8 illustrates a schematic view of some embodiments corresponding to act in block S105.

At block S106, supplying an aromatic hydrocarbon precursor into the processing chamber. FIG. 9 illustrates a schematic view of some embodiments corresponding to act in block S106.

At block S107, turn on an RF power of an RF system, so as to deposit a graphene layer over the metal layer on the substrate. FIG. 10 illustrates a schematic view of some embodiments corresponding to act in block S107.

At block S108, moving out the wafer from the processing chamber. FIG. 11 illustrates a schematic view of some embodiments corresponding to act in block S108.

FIGS. 14 to 31 illustrate a method in various stages of forming a semiconductor device in accordance with some embodiments of the present disclosure.

Figure 14:
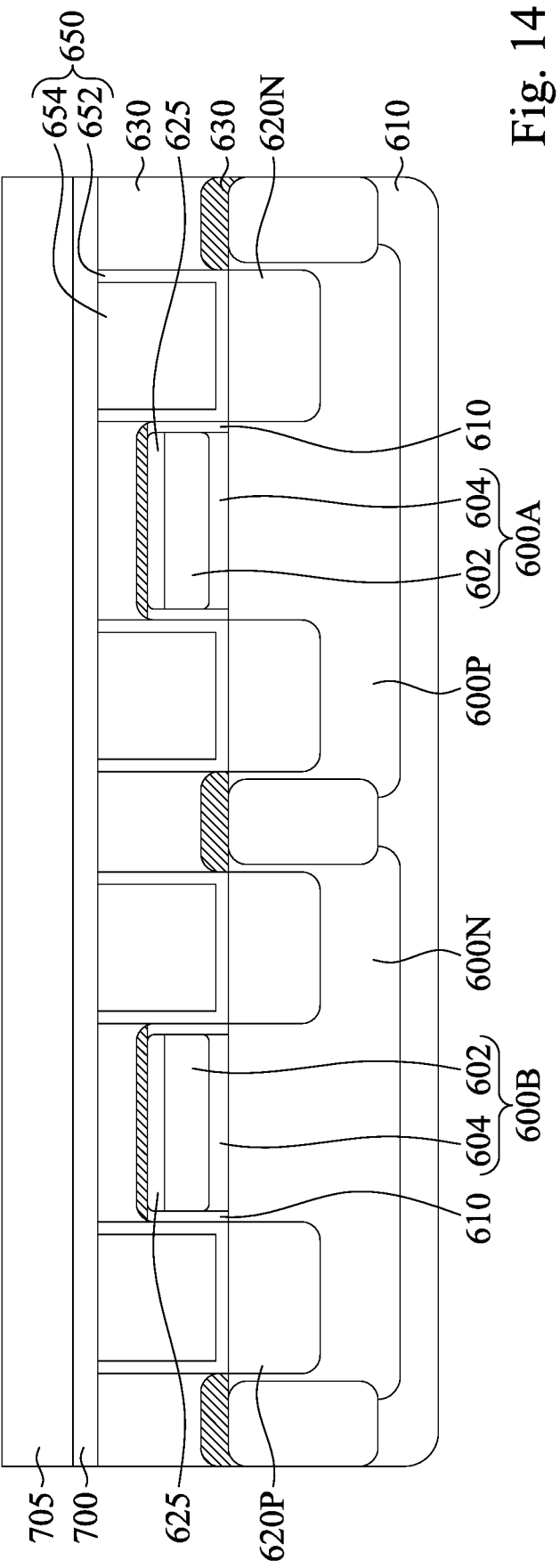
FIGS. 14 to 31 illustrate a method in various stages of forming a semiconductor device in accordance with some embodiments of the present disclosure.

Reference is made to FIG. 14. An initial structure is received. The initial structure includes a substrate 610. The substrate 610 includes an N-well region 600N and a P-well region 600P, in which the N-well region 600N may be doped with N-type impurities, and the P-well region 600P may be doped with P-type impurities. The substrate 610 may be a semiconductor material and may include known structures including a graded layer or a buried oxide, for example. Other materials, such as germanium, quartz, sapphire, and glass could alternatively be used for the substrate 610. Alternatively, the silicon substrate 610 may be an active layer of a semiconductor-on-insulator (SOI) substrate or a multi-layered structure such as a silicon-germanium layer formed on a bulk silicon layer.

Isolation structures 605 are disposed in the substrate 610. In some embodiments, the isolation structures 605 may include oxide, such as silicon dioxide. The isolation structures 605, which act as a shallow trench isolation (STI) around the P-well region 600P from the N-well region 600N, may be formed by chemical vapor deposition (CVD) techniques using tetra-ethyl-ortho-silicate (TEOS) and oxygen as a precursor.

A gate structure 600A is disposed over the P-well region 600P of the substrate 610, and a gate structure 600B is disposed over the N-well region 600N of the substrate 610. In some embodiments, each of the gate structure 600A and the gate structure 600B includes a gate dielectric 602 and a gate electrode 604. In some embodiments, the gate dielectric 602 may be, for example, silicon oxide, silicon nitride, a combination thereof, or the like, and may be deposited or thermally grown according to acceptable techniques. In some embodiments, the gate electrode 604 may include polycrystalline-silicon (poly-Si) or poly-crystalline silicon-germanium (poly-SiGe). In some other embodiments, the gate structure 600A and the gate structure 600B may be metal gate structures, which include a high-k dielectric layer, a work function metal layer over the high-k dielectric layer, and a gate metal over the work function metal layer.

Capping layers 625 are disposed over the gate structures 600A and 600B. In some embodiments, capping layers 625 may be oxide. A plurality of gate spacers 610 are disposed on opposite sides of the gate structure 600A and the gate structure 600B. In some embodiments, the gate spacers 610 may include $SiO_2$, $Si_3N_4$, $SiO_xN_y$, SiC, SiCN films, SiOC, SiOCN films, and/or combinations thereof.

Source/drain structures 620N are disposed in the P-well region 620P of the substrate 610 and on opposite sides of the gate structure 600A, and source/drain structures 620P are disposed in the N-well region 620N of the substrate 610 and on opposite sides of the gate structure 600B. In some embodiments, the source/drain structures 620N may be doped with N-type impurities, and the source/drain structures 620P may be doped with p-type impurities. In some embodiments, the source/drain structures 620N, 620P may be may be formed by performing an epitaxial growth process that provides an epitaxy material over the substrate 610, and thus the source/drain structures 620N, 620P can be interchangeably referred to as epitaxy structures 620N, 620P in this context. In various embodiments, the source/drain structures 620N, 620P may include Ge, Si, GaAs, AlGaAs, SiGe, GaAsP, SiP, or other suitable material.

A contact etch stop layer (CESL) 630 is disposed over the isolation structures 605 and over the capping layers 625. An interlayer dielectric (ILD) layer 640 is disposed over the CESL 630 and surrounds the gate structures 600A and 600B. In some embodiments, the CESL 630 includes silicon nitride, silicon oxynitride or other suitable materials. The CESL 630 can be formed using, for example, plasma enhanced CVD, low pressure CVD, ALD or other suitable techniques. In some embodiments, the ILD layer 640 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 640 may be formed using, for example, CVD, ALD, spin-on-glass (SOG) or other suitable techniques.

Source/drain contacts 650 are disposed in the ILD layer 640 and contact the source/drain structures 620A and 620P. In some embodiments, each source/drain contact 650 includes a liner 652 and a plug 654. The liner 652 is between plug 654 and the underlying source/drain structures 600A or 600B. In some embodiments, the liner 652 assists with the deposition of plug 654 and helps to reduce diffusion of a material of plug 654 through the gate spacers 610. In some embodiments, the liner 652 includes titanium (Ti), titanium nitride (TiN), tantalum (Ta), tantalum nitride (TaN), or another suitable material. The Plug 654 includes a conductive material, such as tungsten (W), copper (Cu), aluminum (Al), ruthenium (Ru), cobalt (Co), molybdenum (Mo), nickel (Ni), or other suitable conductive material.

An etch stop layer (ESL) 700 is disposed over the ILD layer 640 and the source/drain contacts 650. An inter-metal dielectric (IMD) layer 705 is disposed over the ESL 700. The material and the formation method of the ESL 700 are similar to those of the CESL 630. Moreover, the material and the formation method of the IMD layer 705 are similar to those of the ILD layer 640.

Figure 15:
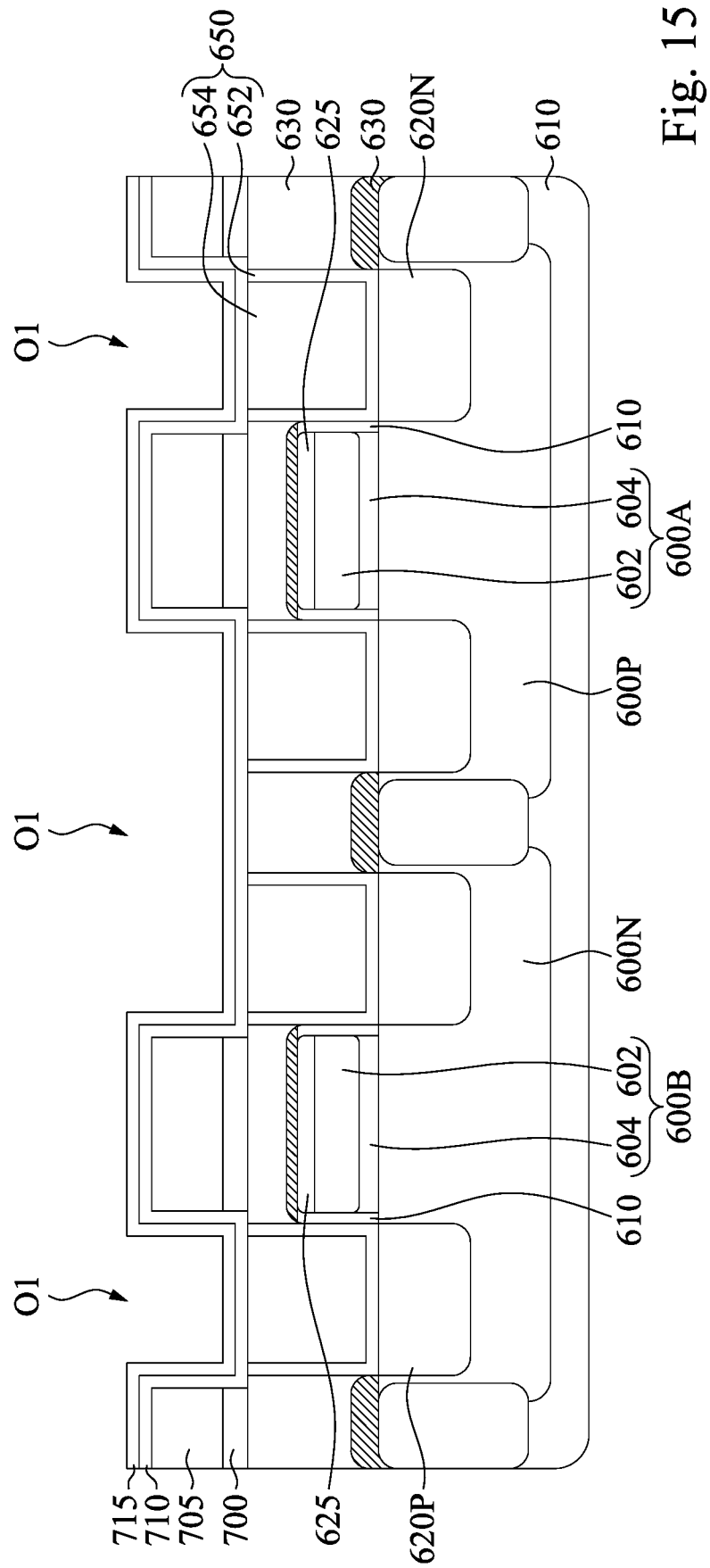

Reference is made to FIG. 15. The ESL 700 and the IMD layer 705 are patterned to form openings O1. Then, a liner 710 and a metal seed layer 715 are formed in the openings O1. In some embodiments, the liner 710 includes titanium (Ti), titanium nitride (TiN), tantalum (Ta), tantalum nitride (TaN), or another suitable material. The metal seed layer 715 may be copper (Cu), cobalt (Co), nickel (Ni), ferrum (Fe), or suitable conductive materials.

Figure 16:
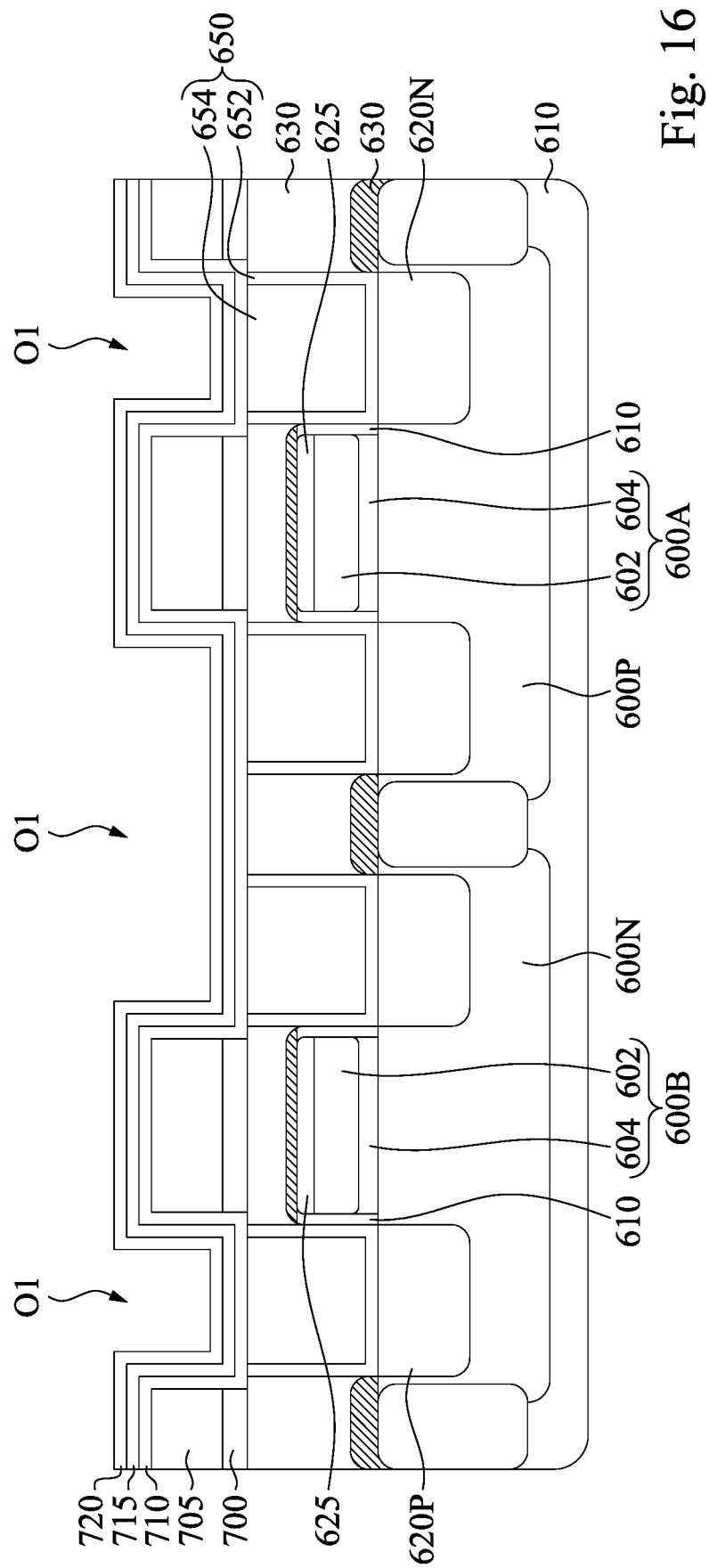

Reference is made to FIG. 16. A graphene layer 720 is deposited over the metal seed layer 715. In some embodiments, the graphene layer 720 can be formed by using the method and deposition systems described in FIGS. 1-13, and thus relevant details will not be repeated herein after. For example, the metal seed layer 715 is similar to the metal layer ML2 of FIGS. 4-11, and the graphene layer 720 is similar to the graphene layer GL of FIGS. 4-11. In some embodiments, the thickness of the graphene layer 720 is in a range from about 1 nm to about 3 nm. With respect to the deposition process of FIG. 10, the deposition time of the graphene layer 720 may be in a range from about 10 seconds to about 20 seconds (e.g., 10 second).

Figure 17:
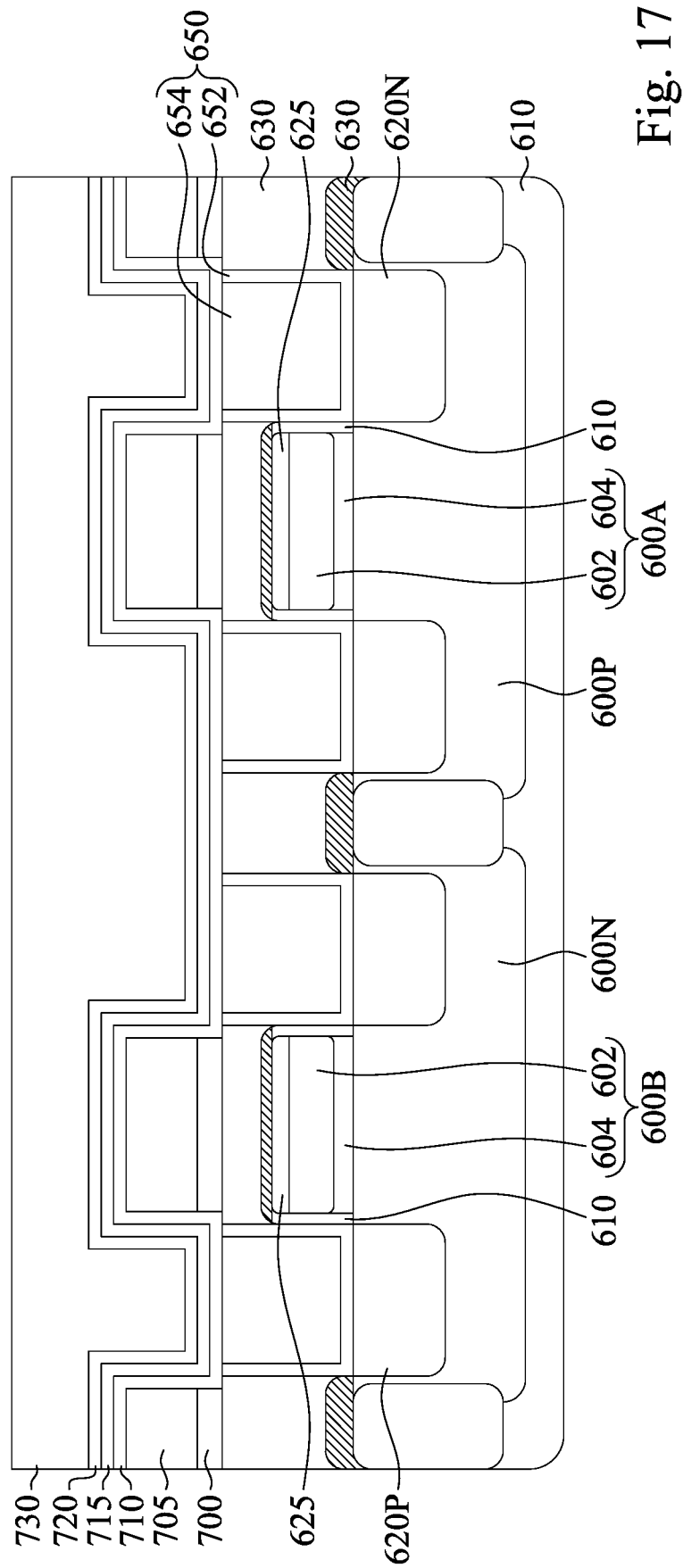

Reference is made to FIG. 17. A filling metal 730 is deposited over the graphene layer 720 and fills the openings O1. In some embodiments, the material of the filling metal 730 may be similar to the metal seed layer 715. In some embodiments, the filling metal 730 may be formed by, for example, PVD, CVD, ALD, electroplating, or suitable processes. In some embodiments, an annealing process may be performed after forming the filling metal 730.

Figure 18:
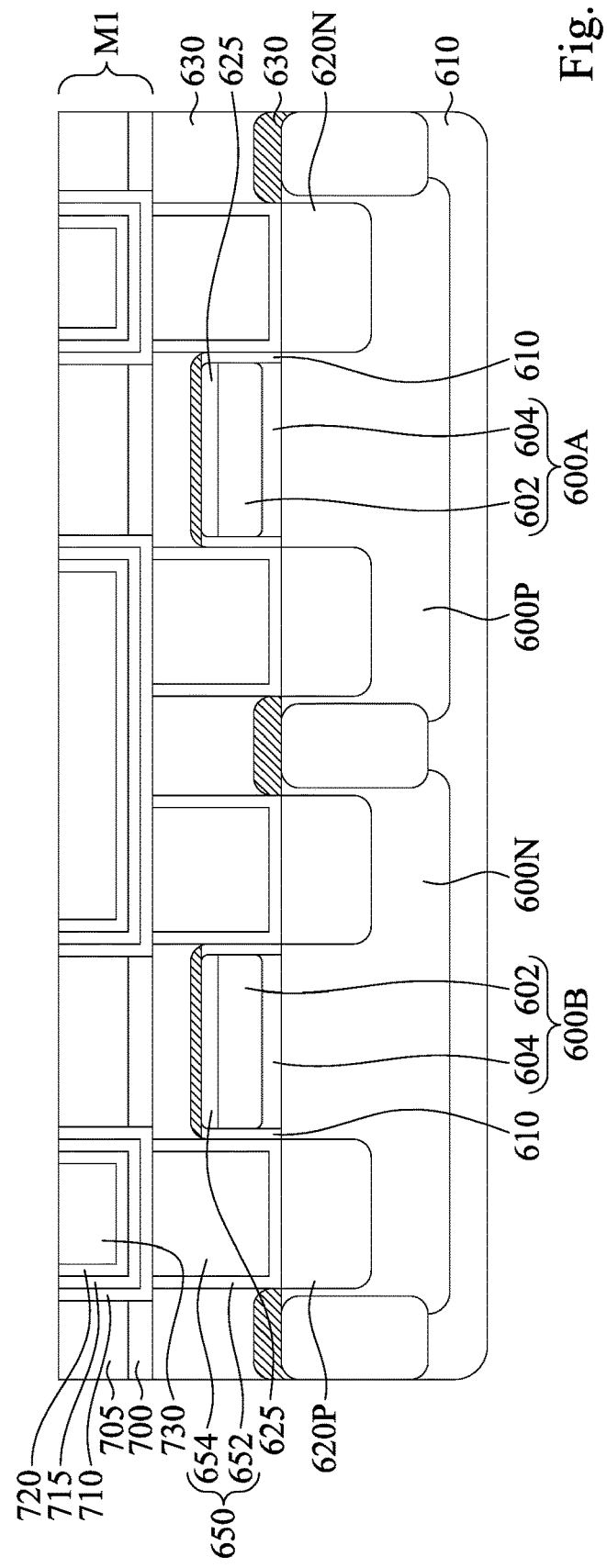

Reference is made to FIG. 18. A chemical mechanical polishing (CMP) process is performed to remove excessive materials of the filling metal 730, the graphene layer 720, the metal seed layer 715, and the liner 710 until the IMD layer 705 is exposed. In some embodiments, the remaining filling metal 730, the graphene layer 720, the metal seed layer 715, and the liner 710 can be referred to as metal-1 (M1) layer in a back end of line (BEOL) process.

Figure 19:
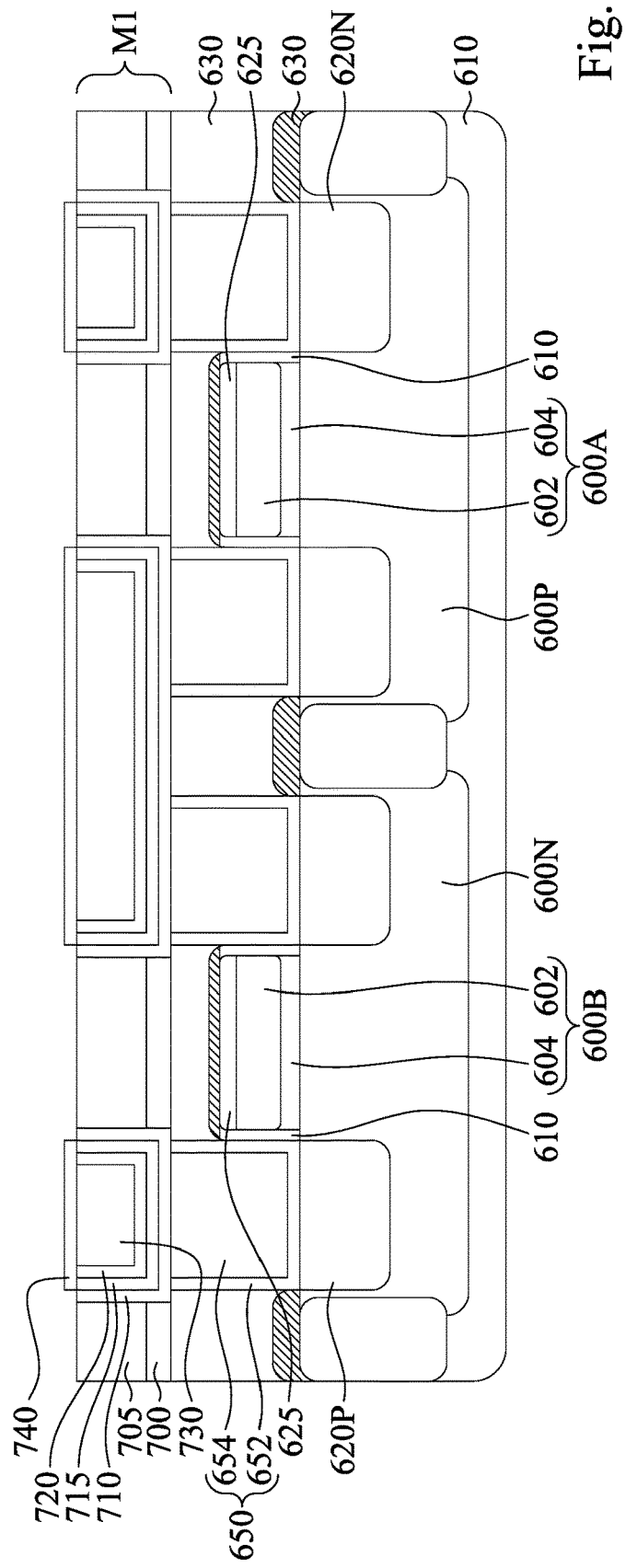

Reference is made to FIG. 19. A plurality of graphene layers 740 are deposited on the remaining filling metal 730, the graphene layer 720, the metal seed layer 715, and the liner 710. In some embodiments, the graphene layers 740 tend to grow on a graphene surface and/or a metal surface rather than on a dielectric surface. As an example in FIG. 19, the graphene layers 740 is selectively formed on the filling metal 730, the graphene layer 720, the metal seed layer 715, and the liner 710, while the graphene layers 740 is not formed on the IMD layer 705. In some embodiments, the graphene layer 740 can be formed by using the method and deposition systems described in FIGS. 1-13, and thus relevant details will not be repeated herein after. For example, the filling metal 730, the graphene layer 720, the metal seed layer 715, and the liner 710 are similar to the metal layer ML2 of FIGS. 4-11, and the graphene layer 740 is similar to the graphene layer GL of FIGS. 4-11. In some embodiments, the thickness of the graphene layer 740 is in a range from about 1 nm to about 3 nm. With respect to the deposition process of FIG. 10, the deposition time of the graphene layer 740 may be in a range from about 10 seconds to about 20 seconds (e.g., 10 second).

Figure 20:
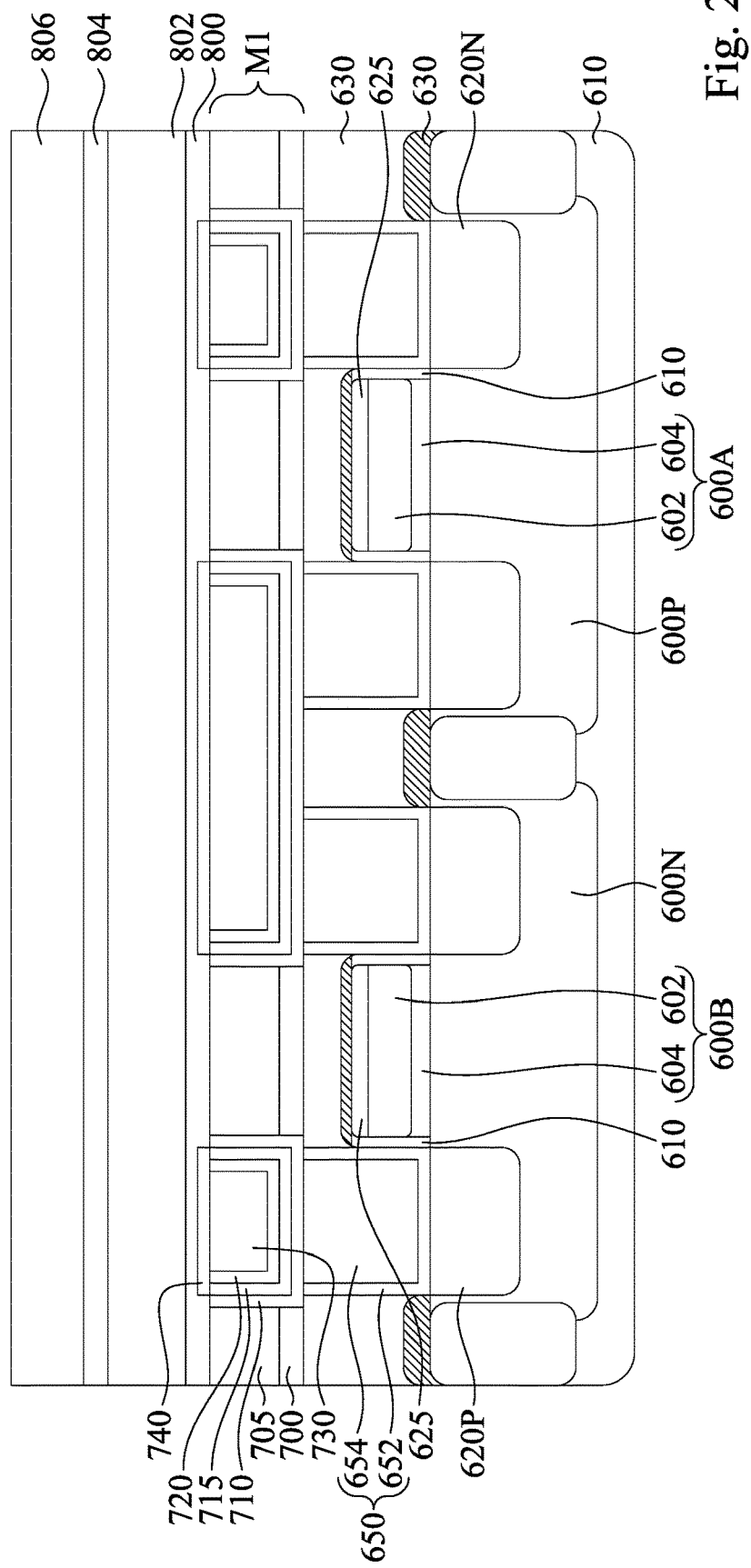

Reference is made to FIG. 20. An ESL 800, an IMD layer 802, an ESL 804, and an IMD layer 806 are formed sequentially over the IMD layer 705. The ESLs 800 and 804 are similar to the ESL 700, the IMD layers 802 and 806 are similar to the IMD layer 705, and thus relevant details will not be repeated for brevity.

Figure 21:
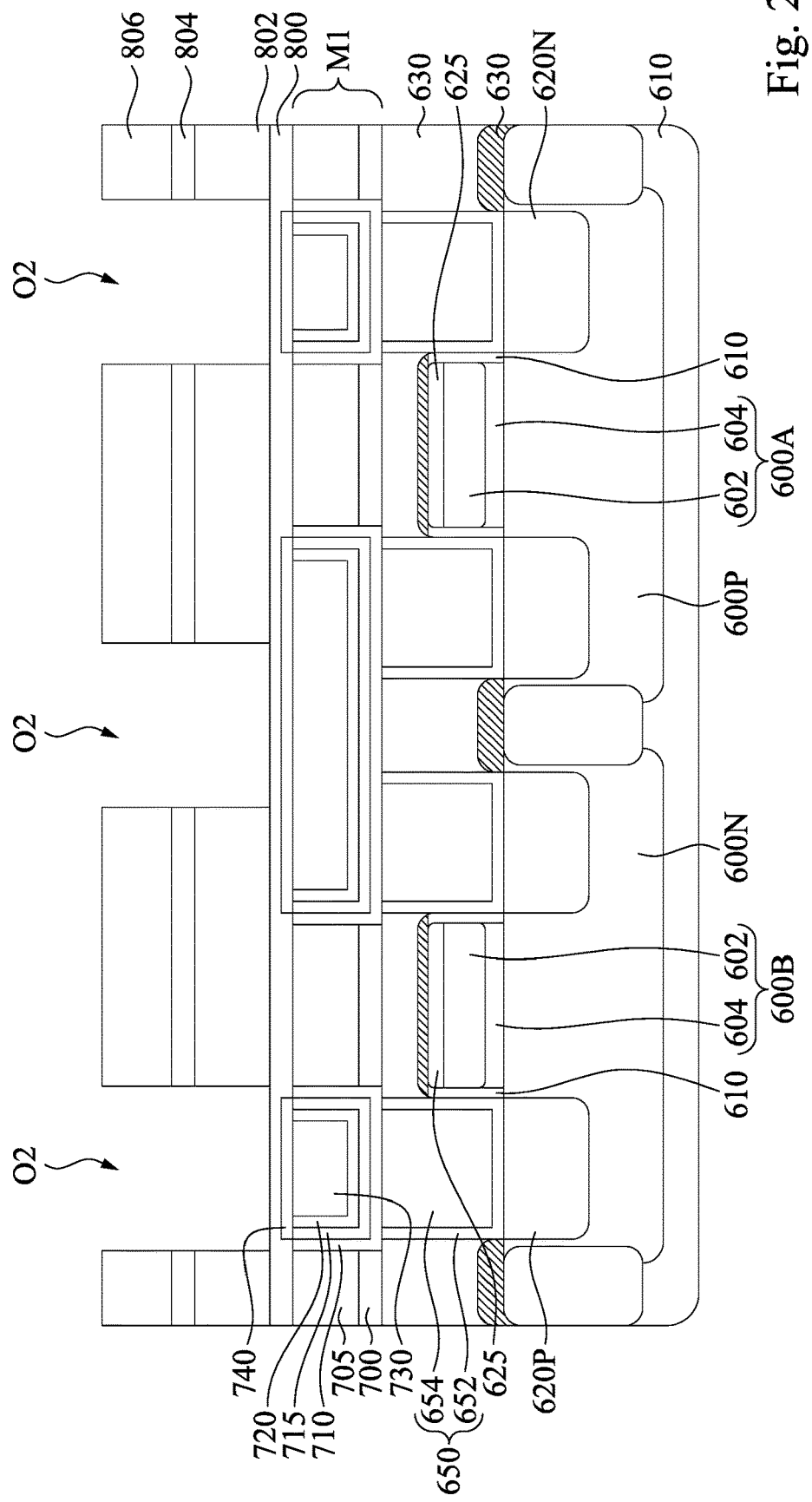

Reference is made to FIG. 21. The ESL 800, the IMD layer 802, the ESL 804, and the IMD layer 806 are patterned to form via openings O2. In some embodiments, the via openings O2 are aligned with and expose the graphene layer 740. In some embodiments, via openings O2 may be formed by, for example, forming a patterned photoresist layer over the IMD layer 806, followed by an etching process to remove portions of the ESL 800, the IMD layer 802, the ESL 804, and the IMD layer 806, and then removing the photoresist layer.

Figure 22:
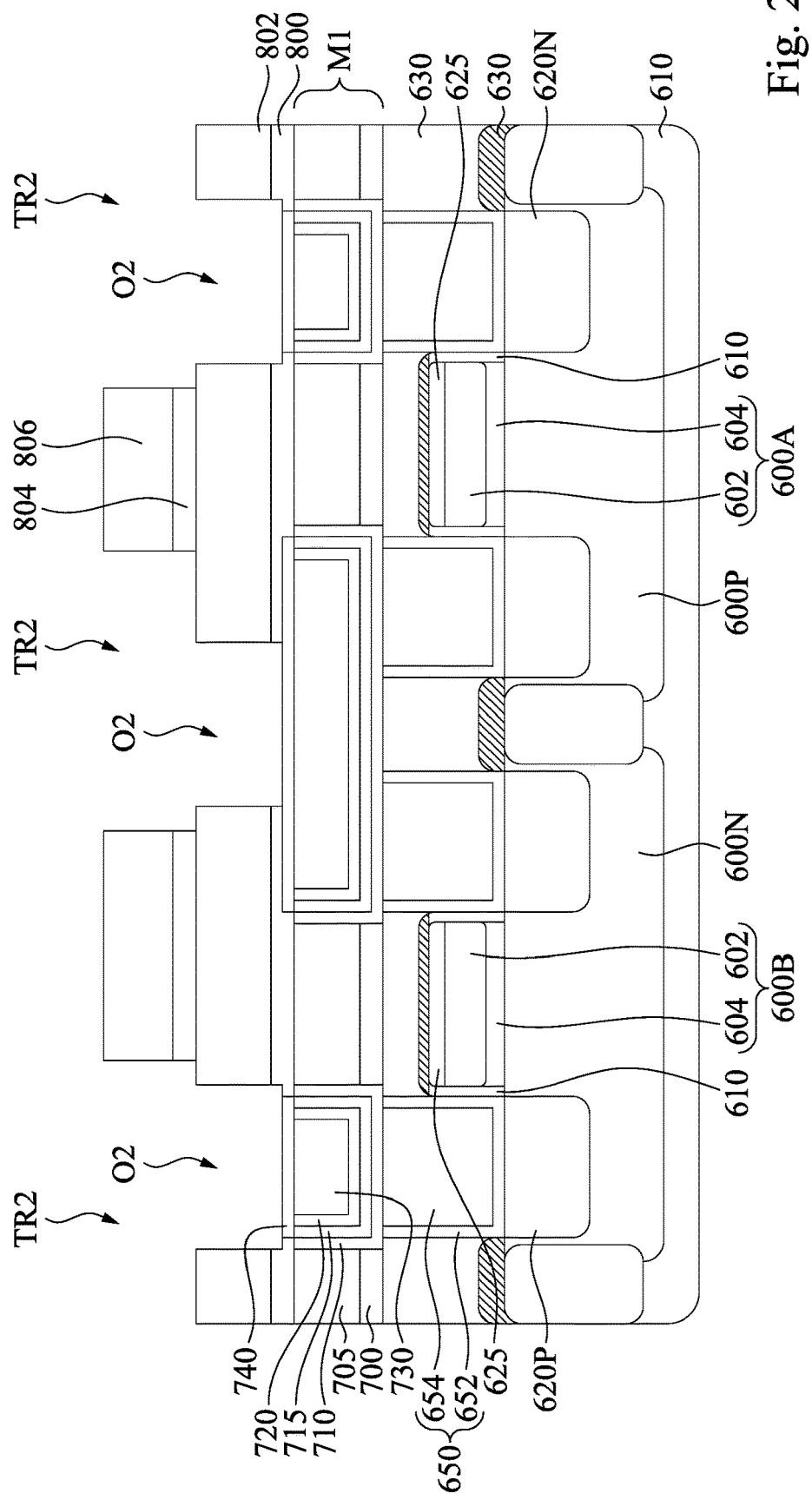

Reference is made to FIG. 22. The ESL 804, and the IMD layer 806 are patterned to form trenches TR2 that are aligned above via openings O2. In some embodiments, trenches TR2 may be formed by, for example, forming a patterned photoresist layer over the IMD layer 806, followed by an etching process to remove portions of the ESL 804, and the IMD layer 806, and then removing the photoresist layer.

Figure 23:
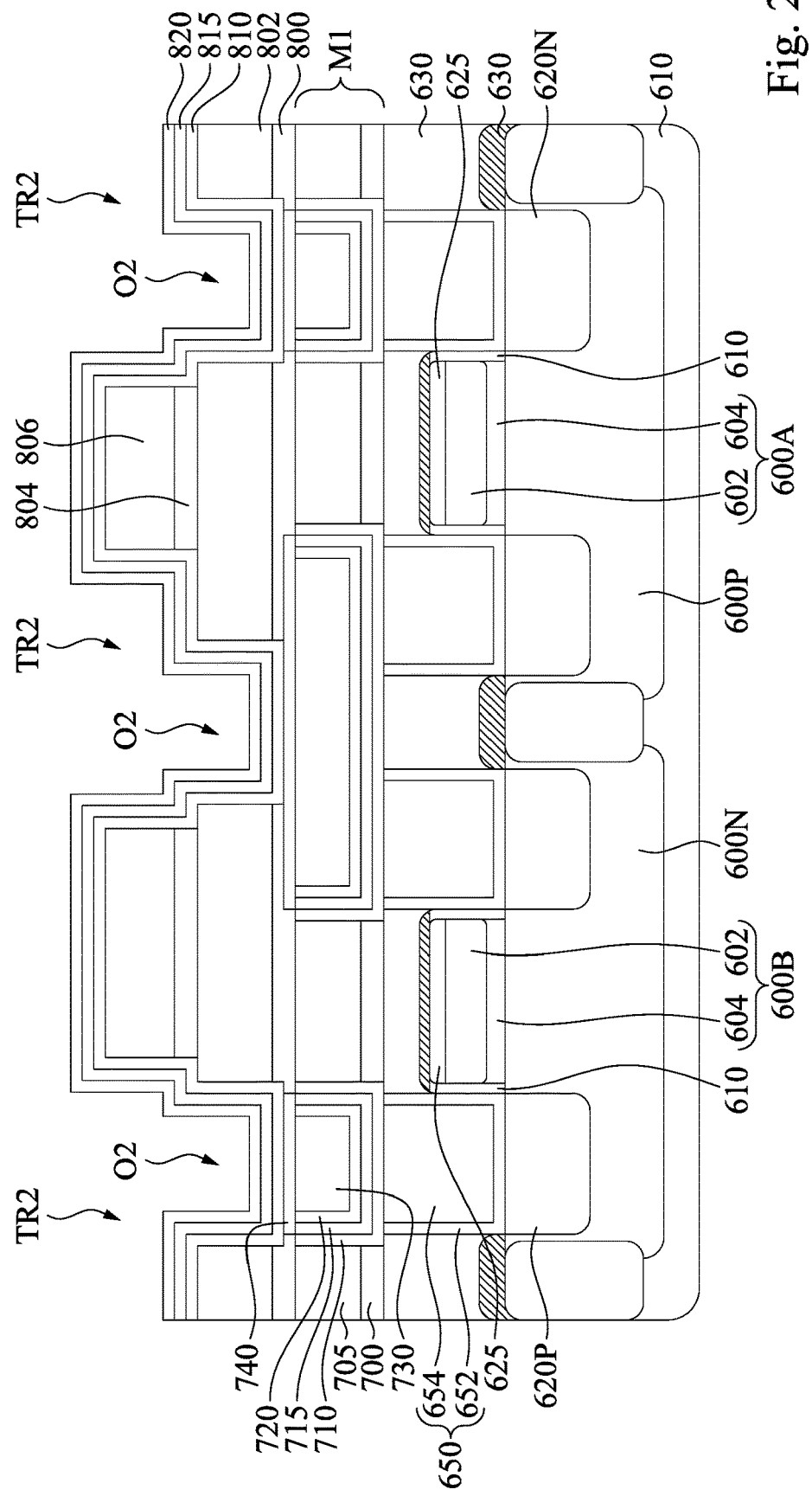

Reference is made to FIG. 23. A liner 810, a metal seed layer 815, and a graphene layer 820 are formed sequentially over the IMD layer 806 and in the via openings O2 and the trenches TR2. The liner 810 and the metal seed layer 815 are similar to the liner 710 and the metal seed layer 715, respectively, and thus relevant details will not be repeated for brevity. In some embodiments, the graphene layer 820 can be formed by using the method and deposition systems described in FIGS. 1-13, and thus relevant details will not be repeated herein after. For example, metal seed layer 815 is similar to the metal layer ML2 of FIGS. 4-11, and the graphene layer 820 is similar to the graphene layer GL of FIGS. 4-11. In some embodiments, the thickness of the graphene layer 820 is in a range from about 3 nm to about 5 nm. With respect to the deposition process of FIG. 10, the deposition time of the graphene layer 820 may be in a range from about 10 seconds to about 20 seconds (e.g., 15 seconds). In some embodiments, the graphene layer 820 is thicker than the graphene layer 720, and the deposition time of the graphene layer 820 is longer than the deposition time of the graphene layer 720.

Figure 24:
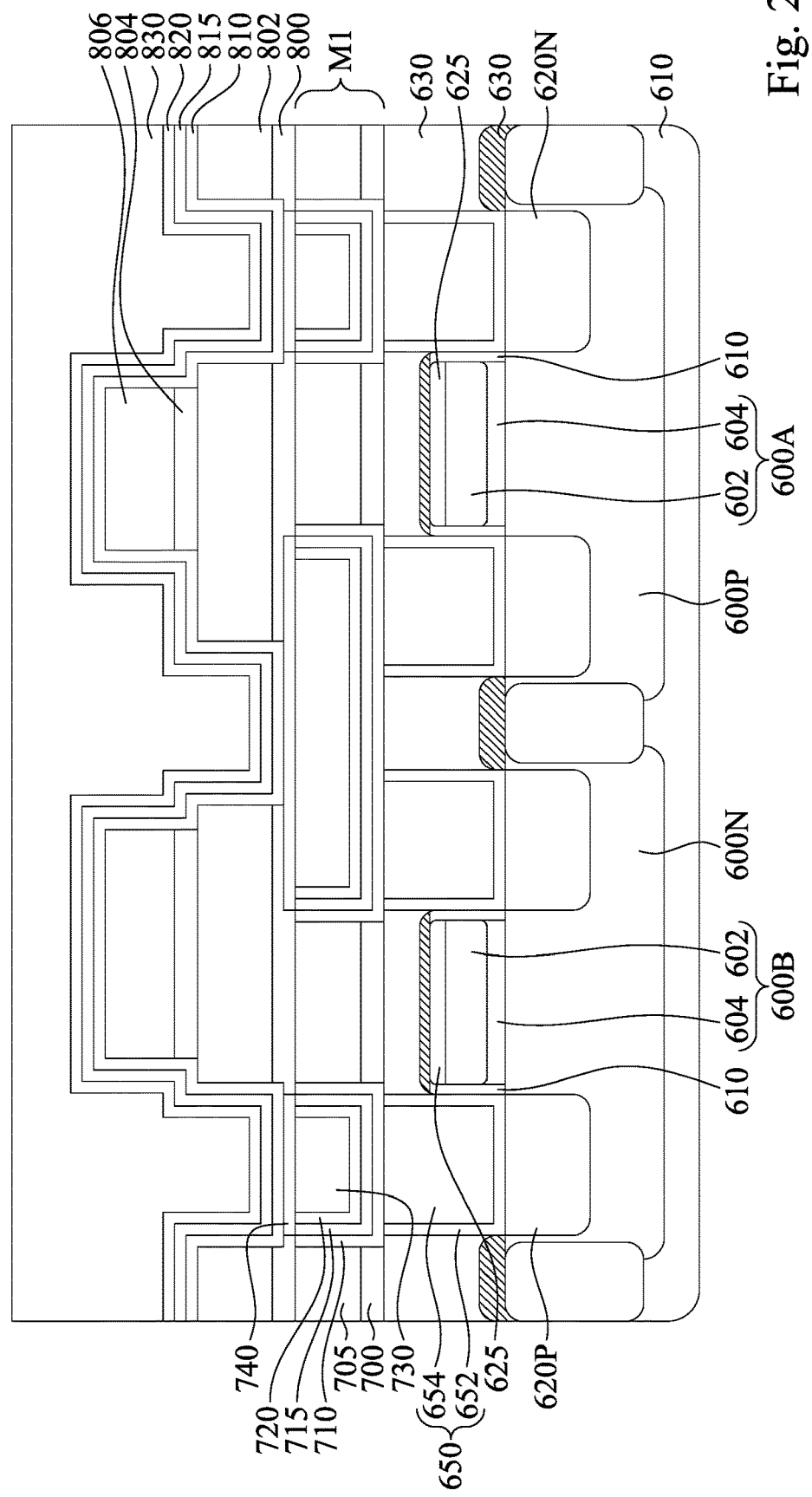

Reference is made to FIG. 24. A filling metal 830 is deposited over the graphene layer 820 and fills the via openings O2 and trenches TR2. The filling metal 830 is similar to the filling metal 730, and thus relevant details will not be repeated herein after.

Figure 25:
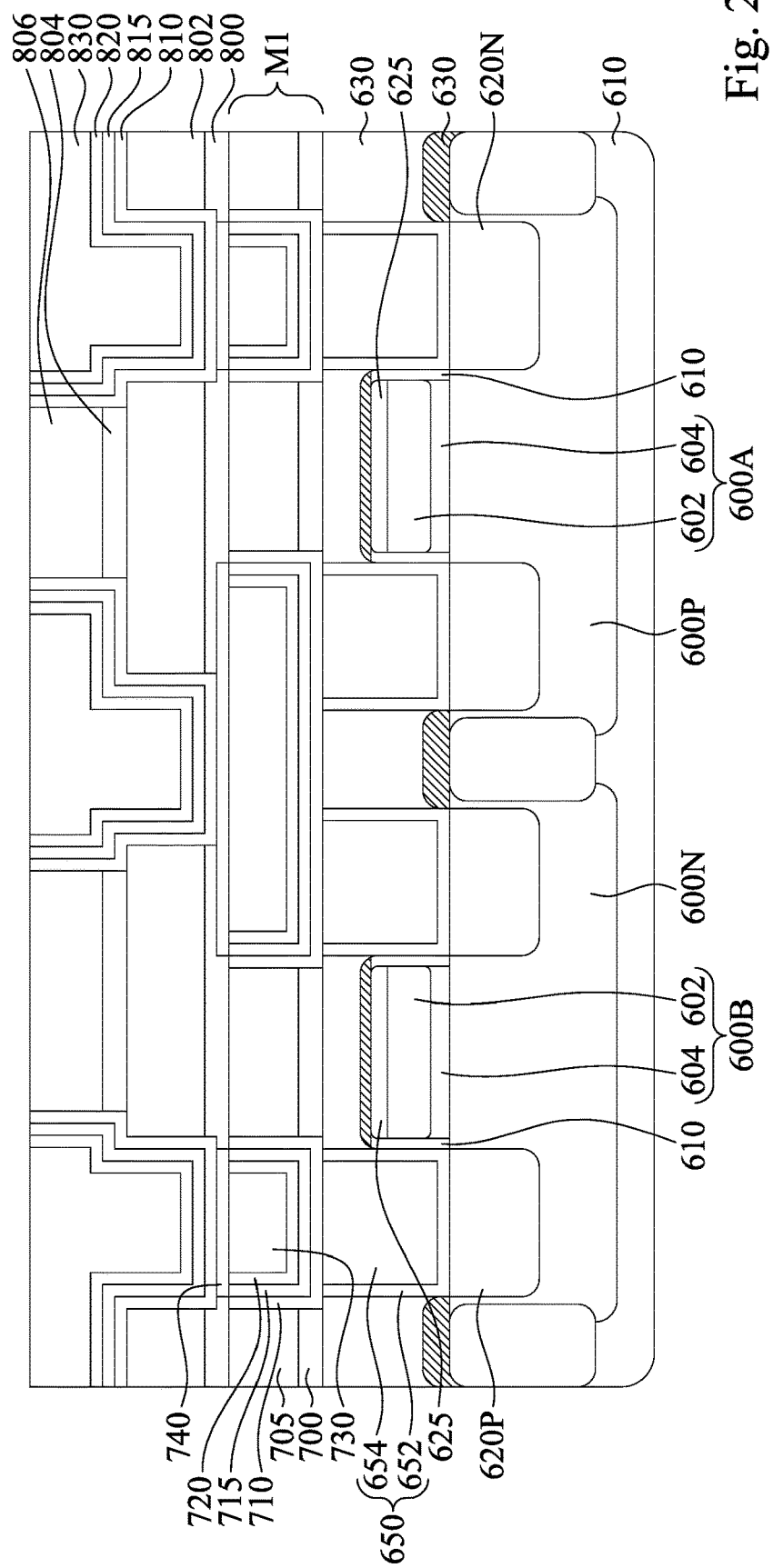

Reference is made to FIG. 25. A chemical mechanical polishing (CMP) process is performed to remove excessive materials of the filling metal 830, the graphene layer 820, the metal seed layer 815, and the liner 810 until the IMD layer 806 is exposed. In some embodiments, the remaining filling metal 830, the graphene layer 820, the metal seed layer 815, and the liner 810 can be referred to as metal-2 (M2) layer in a back end of line (BEOL) process. In some embodiments, the line width of metal-2 layer is greater than the line width of metal-1 layer (see FIG. 18), so the graphene layers 820 of metal-2 layer can be formed thicker than the graphene layer 720 of metal-1 layer.

Figure 26:
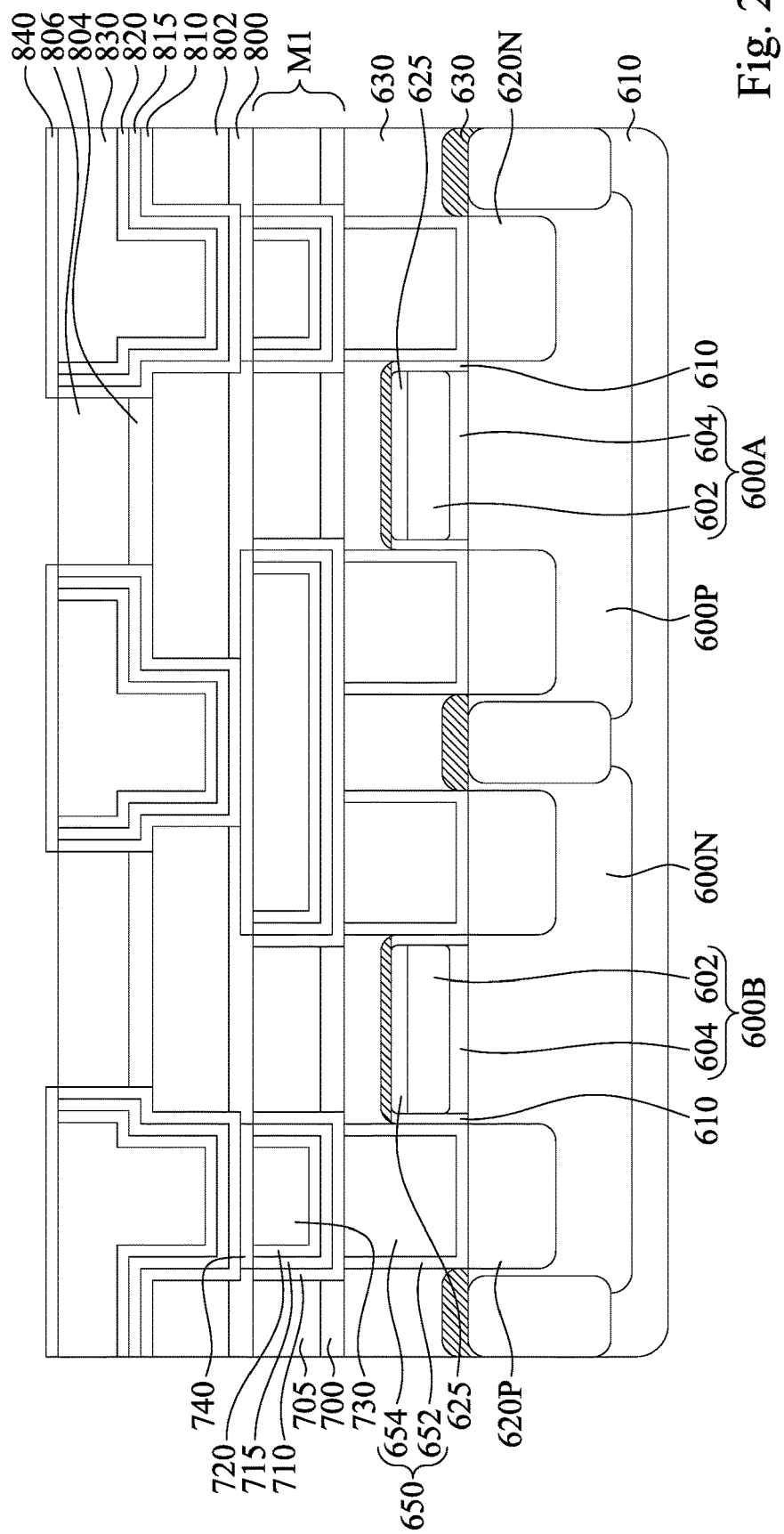

Reference is made to FIG. 26. A plurality of graphene layers 840 are deposited on the remaining filling metal 830, the graphene layer 820, the metal seed layer 815, and the liner 810. In some embodiments, the graphene layers 840 tend to grow on a graphene surface and/or a metal surface rather than on a dielectric surface. For example, the graphene layers 840 is selectively formed on the filling metal 830, the graphene layer 820, the metal seed layer 815, and the liner 810, while the graphene layers 840 is not formed on the IMD layer 806. In some embodiments, the graphene layer 840 can be formed by using the method and deposition systems described in FIGS. 1-13, and thus relevant details will not be repeated herein after. For example, the filling metal 830, the graphene layer 820, the metal seed layer 815, and the liner 810 are similar to the metal layer ML2 of FIGS. 4-11, and the graphene layer 840 is similar to the graphene layer GL of FIGS. 4-11. In some embodiments, the thickness of the graphene layer 820 is in a range from about 3 nm to about 5 nm. With respect to the deposition process of FIG. 10, the deposition time of the graphene layer 840 may be in a range from about 10 seconds to about 20 seconds (e.g., 15 seconds).

Figure 27:
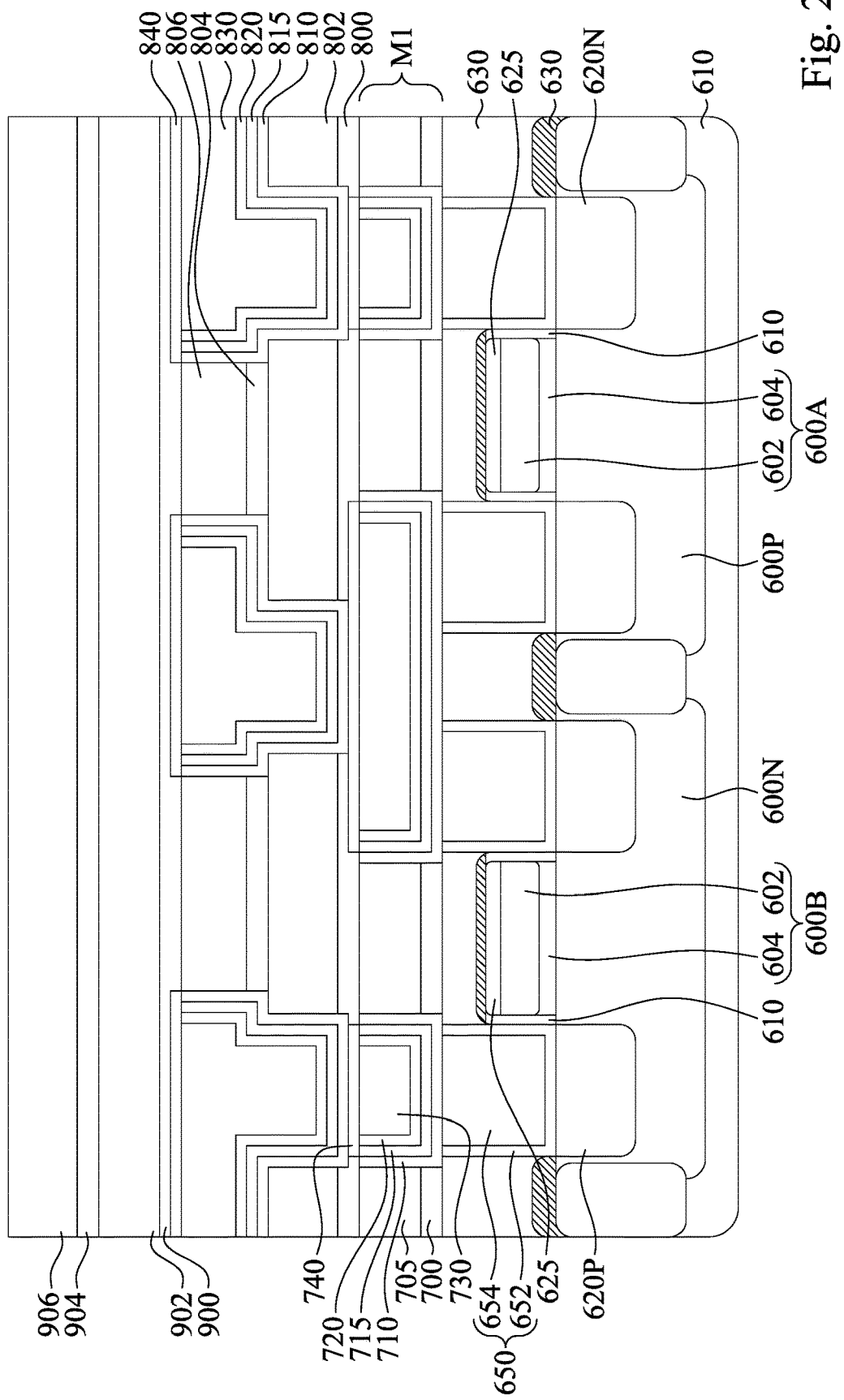

Reference is made to FIG. 27. An ESL 900, an IMD layer 902, an ESL 904, and an IMD layer 906 are formed sequentially over the IMD layer 806. The ESLs 900 and 904 are similar to the ESL 700, the IMD layers 902 and 906 are similar to the IMD layer 705, and thus relevant details will not be repeated for brevity.

Figure 28:
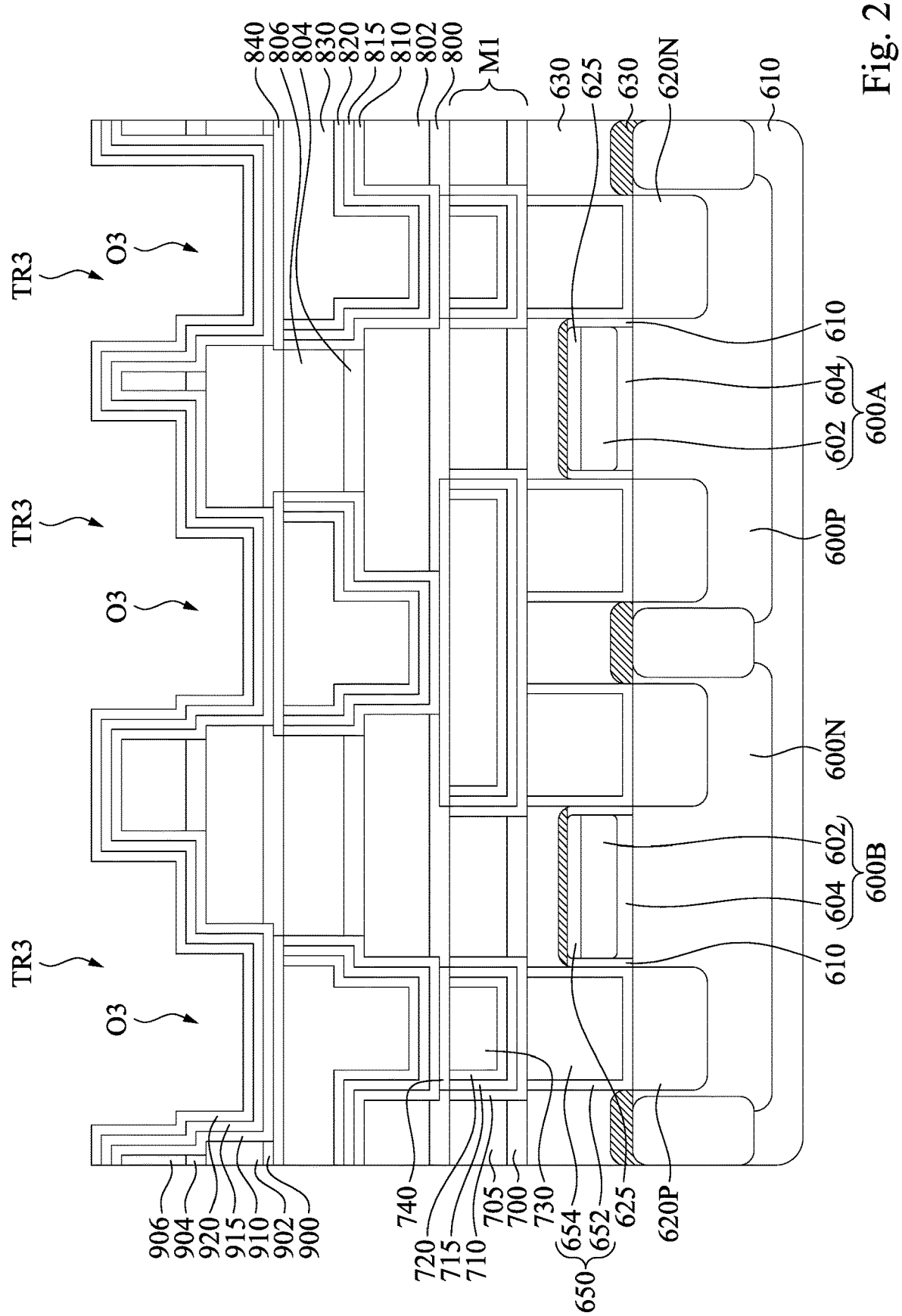

Reference is made to FIG. 28. The ESL 900, the IMD layer 902, the ESL 904, and the IMD layer 906 are patterned to form via openings O3 and trenches TR3 above the via openings O3. The formation of the via openings O3 and the trenches TR3 are similar to the via openings O2 and the trenches TR2 described in FIGS. 21 and 22, and thus relevant details will not be repeated for brevity.

Then, a liner 910, a metal seed layer 915, and a graphene layer 920 are formed sequentially over the IMD layer 906 and in the via openings O3 and the trenches TR3. The liner 910 and the metal seed layer 915 are similar to the liner 710 and the metal seed layer 715, respectively, and thus relevant details will not be repeated for brevity. In some embodiments, the graphene layer 920 can be formed by using the method and deposition systems described in FIGS. 1-13, and thus relevant details will not be repeated herein after. In some embodiments, the thickness of the graphene layer 920 is in a range from about 3 nm to about 10 nm. With respect to the deposition process of FIG. 10, the deposition time of the graphene layer 920 may be in a range from about 10 seconds to about 30 seconds (e.g., 30 seconds). In some embodiments, the graphene layer 920 is thicker than the graphene layer 820, and the deposition time of the graphene layer 920 is longer than the deposition time of the graphene layer 920.

Figure 29:
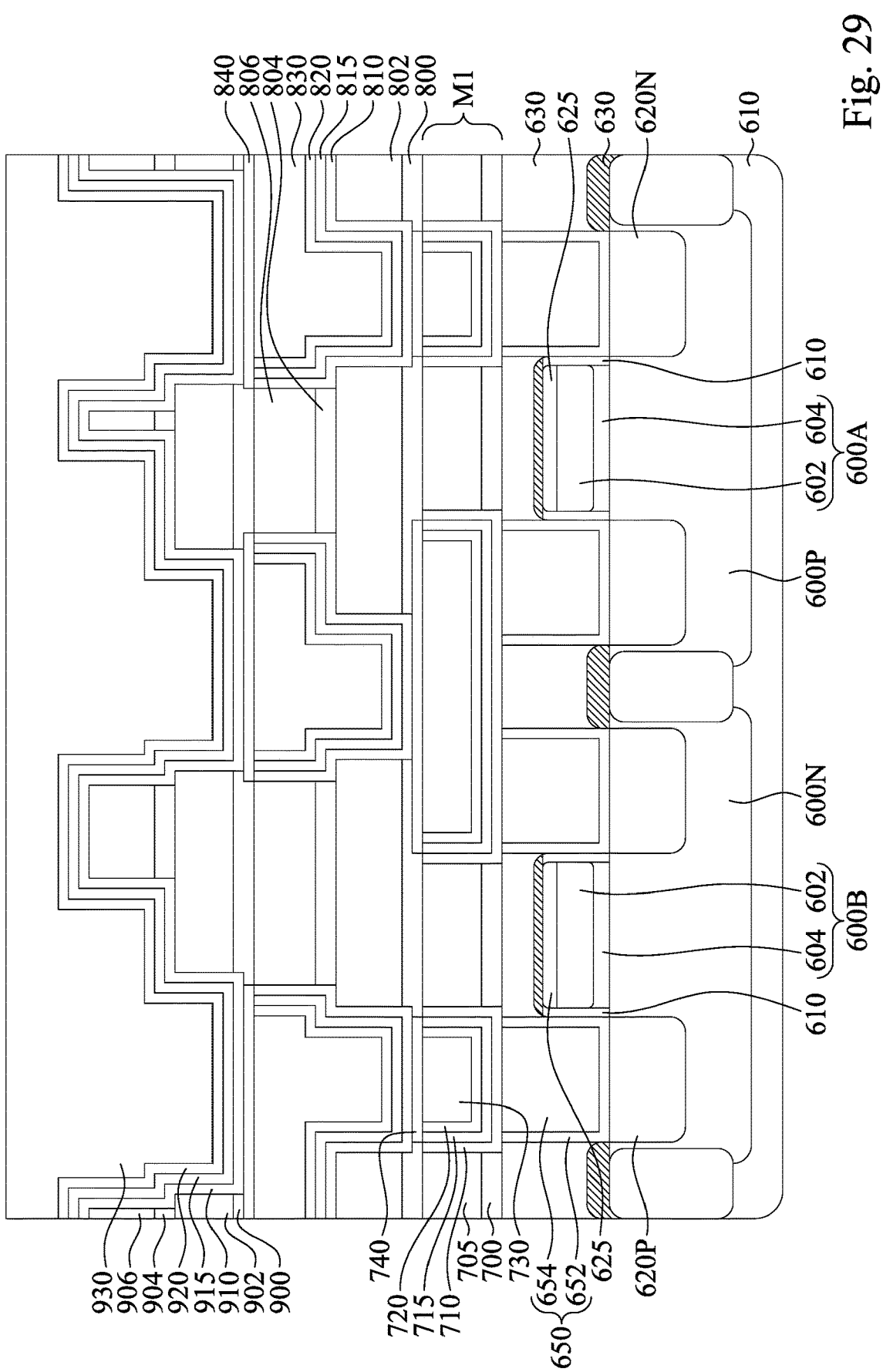

Reference is made to FIG. 29. A filling metal 930 is deposited over the graphene layer 920 and fills the via openings O3 and trenches TR3. The filling metal 930 is similar to the filling metal 730, and thus relevant details will not be repeated herein after.

Figure 30:
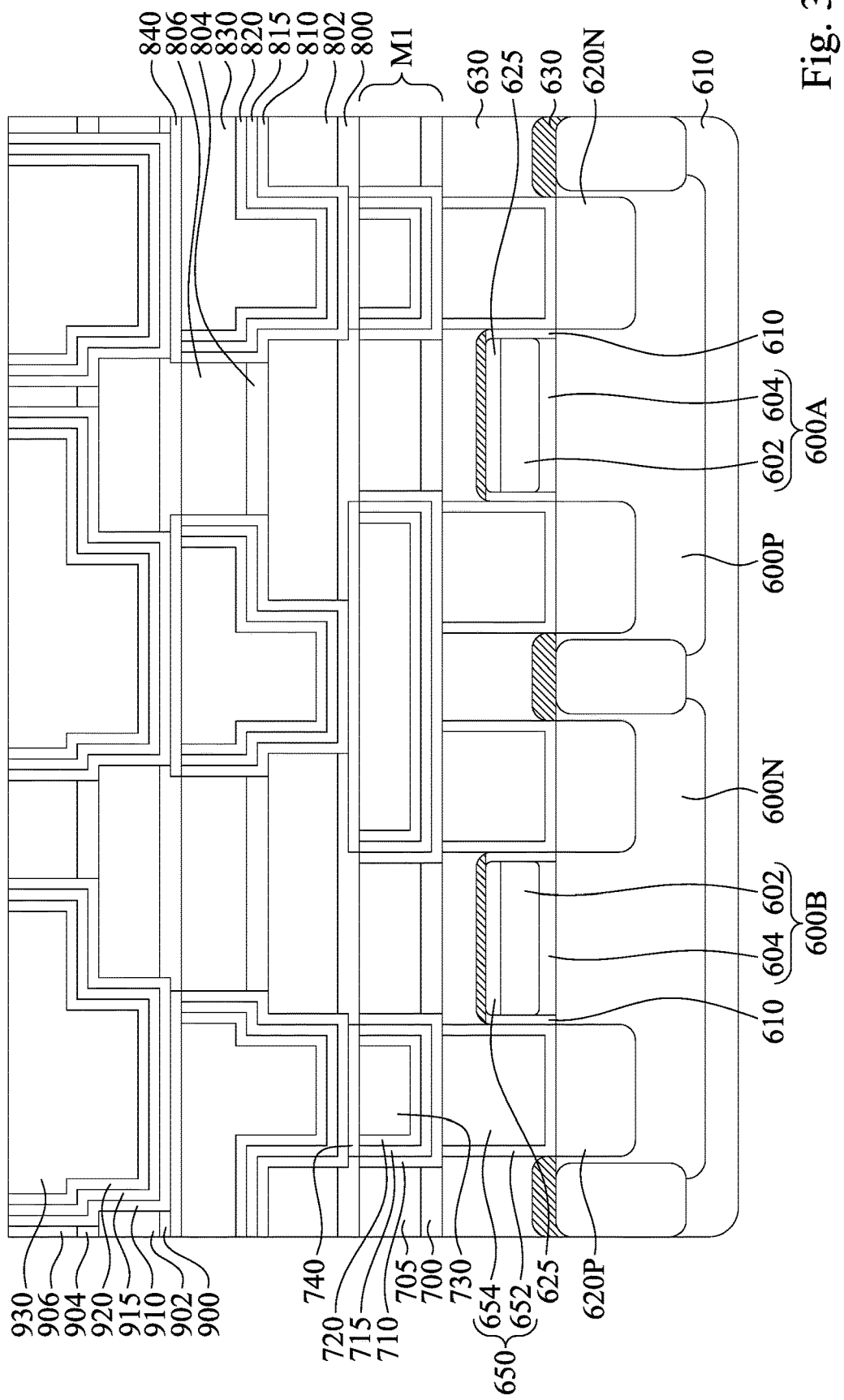

Reference is made to FIG. 30. A chemical mechanical polishing (CMP) process is performed to remove excessive materials of the filling metal 930, the graphene layer 920, the metal seed layer 915, and the liner 910 until the IMD layer 906 is exposed. In some embodiments, the remaining filling metal 930, the graphene layer 920, the metal seed layer 915, and the liner 910 can be referred to as metal-3 (M3) layer in a back end of line (BEOL) process. In some embodiments, the line width of metal-3 layer is greater than the line width of metal-2 layer (see FIG. 25), so the graphene layers 920 of metal-3 layer can be formed thicker than the graphene layer 820 of metal-2 layer.

Figure 31:
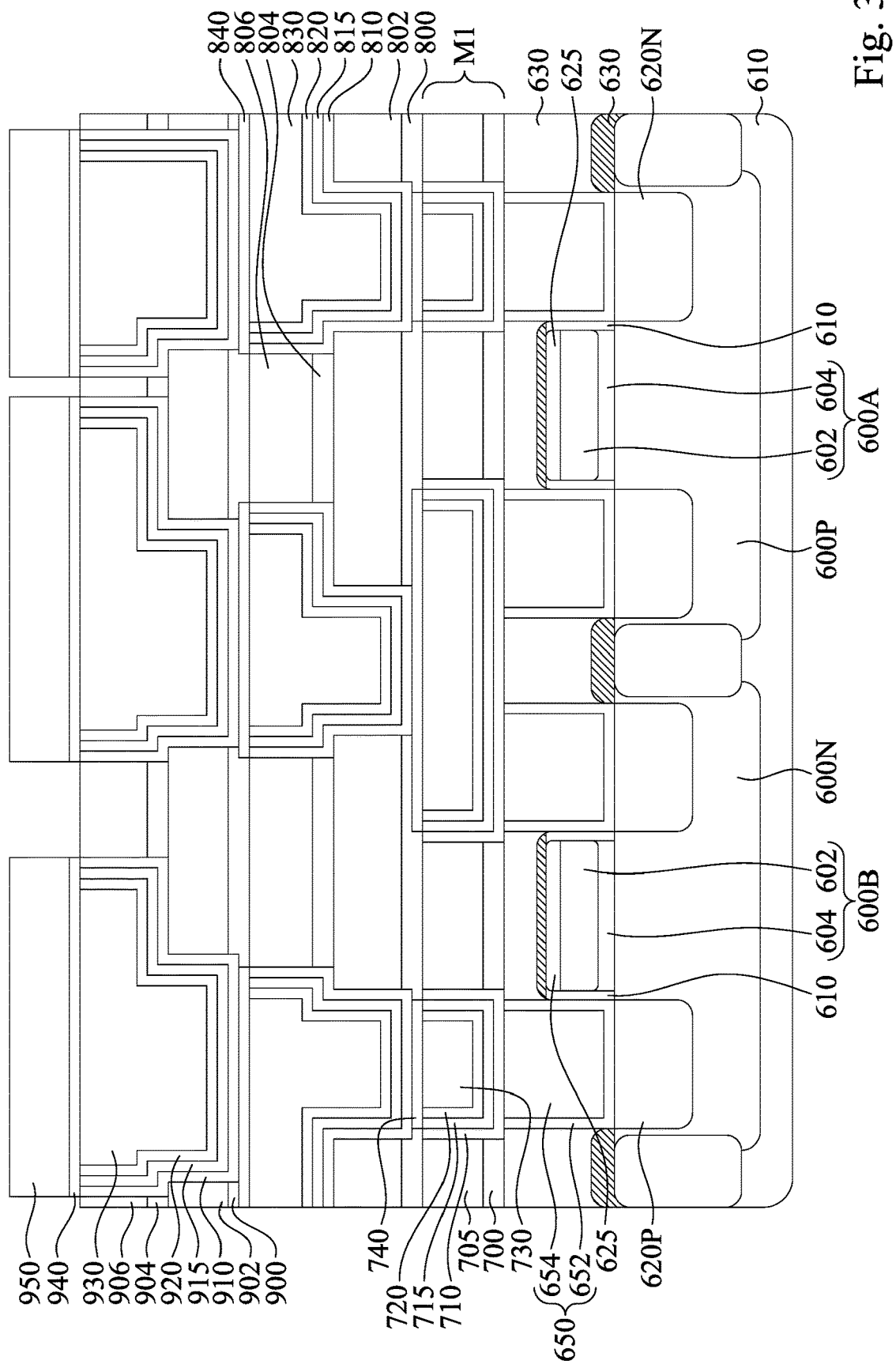

Reference is made to FIG. 31. A plurality of graphene layers 940 are deposited on the remaining filling metal 930, the graphene layer 920, the metal seed layer 915, and the liner 910. In some embodiments, the graphene layers 940 tend to grow on a graphene surface and/or a metal surface rather than on a dielectric surface. For example, the graphene layers 940 is selectively formed on the filling metal 930, the graphene layer 920, the metal seed layer 915, and the liner 910, while the graphene layers 940 is not formed on the IMD layer 906. In some embodiments, the graphene layer 940 can be formed by using the method and deposition systems described in FIGS. 1-13, and thus relevant details will not be repeated herein after. In some embodiments, the thickness of the graphene layer 940 is in a range from about 3 nm to about 10 nm. With respect to the deposition process of FIG. 10, the deposition time of the graphene layer 940 may be in a range from about 10 seconds to about 30 seconds (e.g., 30 seconds). In some embodiments, the graphene layer 940 is thicker than the graphene layer 840, and the deposition time of the graphene layer 940 is longer than the deposition time of the graphene layer 940.

Then, a plurality of conductive layers 950 are formed respectively over the graphene layers 940. In some embodiments, conductive layers 950 may be aluminum, or other suitable conductive materials. In some embodiments, the conductive layers 950 can be formed by PVD, CVD, ALD, or other suitable process. In some embodiments, the conductive layers 950 can be formed by, for example, depositing a conductive material over the substrate 610, followed by a photolithography process to pattern the conductive material to form the conductive layers 950.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that a graphene layer is deposited using an aromatic hydrocarbon precursor during an inductively coupled plasma chemical vapor deposition process, the graphene layer can be deposited in a short time and having a good quality. Another advantage is that the graphene layer can be deposited in a low temperature, and such temperature would not destroy semiconductor devices formed on the wafer, which will improve the device yield.

In some embodiments of the present disclosure, a method includes loading a wafer into a processing chamber equipped with an RF system; supplying an aromatic hydrocarbon precursor into the processing chamber; after supplying the aromatic hydrocarbon precursor, turning on an RF power of the RF system to decompose the aromatic hydrocarbon precursor into active radicals and produce a graphene layer over a metal layer on the wafer; and after an entirety of the metal layer being covered by the graphene layer, turning off the RF power of the RF system to stop forming the graphene layer.

In some embodiments of the present disclosure, a method includes forming a transistor over a substrate; forming a source/drain contact over a source/drain structure of the transistor; forming a first dielectric layer over the source/drain contact; etching the first dielectric layer to form a first opening in the first dielectric layer; depositing a first seed layer in the first opening; depositing a first graphene layer over the first seed layer using an aromatic hydrocarbon precursor with an RF power turned on; depositing a filling metal to overfill a remainder of the first opening; performing a chemical mechanical polishing (CMP) process on the filling metal until the first dielectric layer is exposed.

In some embodiments of the present disclosure, a deposition system includes a processing chamber, a coil, a liquid aromatic hydrocarbon source, a first gas line, a first control valve, and an RF system. The coil winds around the processing chamber. The first gas line connects the processing chamber and the liquid aromatic hydrocarbon source. The first control valve is in the first gas line and operative to allow a volatilized aromatic hydrocarbon gas from the liquid aromatic hydrocarbon source to flow into the processing chamber. The RF system is electrically coupled to the coil, in which the RF system is operative to trigger graphene deposition by ionizing the aromatic hydrocarbon gas in the processing chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    loading a wafer into a processing chamber equipped with an RF system;
    supplying an aromatic hydrocarbon precursor into the processing chamber;
    after supplying the aromatic hydrocarbon precursor, turning on an RF power of the RF system to decompose the aromatic hydrocarbon precursor into active radicals and produce a graphene layer over a metal layer on the wafer; and
    after an entirety of the metal layer being covered by the graphene layer, turning off the RF power of the RF system to stop forming the graphene layer.

2. The method of claim 1, wherein the aromatic hydrocarbon precursor is supplied into the processing chamber without using a carrier gas.

3. The method of claim 1, wherein turning on the RF power of the RF system raises a temperature in the processing chamber to about 200° C. to about 400° C.

4. The method of claim 3, wherein the RF power is in a range from about 250 W to about 400 W.

5. The method of claim 4, wherein a flow rate of the aromatic hydrocarbon precursor is in a range from about 0.5 sccm to about 1 sccm.

6. The method of claim 3, wherein the temperature in the processing chamber is raised to about 200° C. to about 400° C. without using a heater other than the RF system.

7. The method of claim 1, wherein the active radicals are free of benzene ring.

8. The method of claim 1, wherein a time duration between turning on the RF power and turning off the RF power is in a range from about 30 seconds to about 120 seconds.

9. The method of claim 1, wherein the graphene layer is produced by a cyclization reaction that the active radicals are combined and transformed into benzene rings.

10. The method of claim 1, wherein prior to turning on the RF power of the RF system, the processing chamber is substantially filled with pure aromatic hydrocarbon precursor.

11. A method, comprising:
    forming a transistor over a substrate;
    forming a source/drain contact over a source/drain structure of the transistor;
    forming a first dielectric layer over the source/drain contact;
    etching the first dielectric layer to form a first opening in the first dielectric layer;
    depositing a first seed layer in the first opening;
    depositing a first graphene layer over the first seed layer using an aromatic hydrocarbon precursor with an RF power turned on;
    depositing a filling metal to overfill a remainder of the first opening; and
    performing a chemical mechanical polishing (CMP) process on the filling metal until the first dielectric layer is exposed.

12. The method of claim 11, further comprising cleaning the first seed layer using a hydrogen plasma prior to depositing the first graphene layer.

13. The method of claim 12, further comprising pumping out a hydrogen gas used for generating the hydrogen plasma.

14. The method of claim 11, further comprising:
    selectively depositing a second graphene layer over the filling metal, the first graphene layer, and the seed layer, and not over the first dielectric layer using an aromatic hydrocarbon precursor with an RF power turned on.

15. The method of claim 11, further comprising:
    depositing a second dielectric layer over the first dielectric layer;
    depositing a third dielectric layer over the second dielectric layer;
    patterning the second and third dielectric layers to form a via opening in the second and third dielectric layers;
    patterning the third dielectric layer to form a trench above the via opening, wherein the trench is wider than the via opening;
    depositing a second seed layer in via opening and the trench; and
    depositing a second graphene layer over the second seed layer using an aromatic hydrocarbon precursor with an RF power turned on.

16. The method of claim 15, wherein a time duration of depositing the second graphene layer is longer than a time duration of depositing the first graphene layer.

17. The method of claim 11, wherein a time duration of depositing the first graphene layer is in a range from about 30 seconds to about 120 seconds.

18. The method of claim 11, wherein the first graphene layer is deposited at a temperature in a range from about 200° C. to about 400° C.

19. A deposition system, comprising:
    a processing chamber;
    a coil winding around the processing chamber;

a liquid aromatic hydrocarbon source;

a first gas line connecting the processing chamber and the liquid aromatic hydrocarbon source;

a first control valve in the first gas line and operative to allow a volatilized aromatic hydrocarbon gas from the liquid aromatic hydrocarbon source to flow into the processing chamber; and an RF system electrically coupled to the coil, wherein the RF system is operative to trigger graphene deposition by ionizing the aromatic hydrocarbon gas in the processing chamber.

20. The deposition system of claim 19, further comprising:

a hydrogen gas source;

a second gas line connecting the processing chamber and the hydrogen gas source; and a second control valve in the second gas line, wherein the second control valve and the first control valve are non-simultaneously turned on.

\* \* \* \* \*